US012737970B2

(12) United States Patent
Arce

(10) Patent No.: US 12,737,970 B2
(45) Date of Patent: Sep. 15, 2026

(54) SYSTEMS AND METHOD FOR PHYSICALLY BASED RENDERING

(71) Applicant: Hexagon Technology Center GmbH, Heerbrugg (CH)

(72) Inventor: Alfredo Arce, Madison, AL (US)

(73) Assignee: Hexagon Technology Center GmbH, Heerbrugg (CH)

( * ) Notice: Subject to any disclaimer, the term of this patent is extended or adjusted under 35 U.S.C. 154(b) by 178 days.

(21) Appl. No.: 18/662,486

(22) Filed: May 13, 2024

(65) Prior Publication Data

US 2025/0349068 A1 Nov. 13, 2025

(51) Int. Cl.
*G06T 15/80* (2011.01)
*G06F 30/12* (2020.01)

(52) U.S. Cl.
CPC .............. *G06T 15/80* (2013.01); *G06F 30/12* (2020.01); *G06T 2200/24* (2013.01)

(58) Field of Classification Search
CPC ... G06T 15/80; G06T 2200/24; G06T 11/001; G06T 19/20; G06T 17/00; G06T 2219/2012; G06F 30/12; G06F 30/10
See application file for complete search history.

(56) References Cited

U.S. PATENT DOCUMENTS 8,525,846 B1 * 9/2013 Hickman .............. G06T 15/005 345/589
2019/0266788 A1 * 8/2019 Huynh-Thu ............ G06F 30/10

OTHER PUBLICATIONS

Fang et al. Make-it-Real: Unleashing Large Multimodal Model's Ability for Painting 3D Objects with Realistic Materials [Online]. Apr. 25, 2024 [Retrieved on Dec. 18, 2025]. Retrieved from the Internet: <URL: https://arxiv.org/pdf/2404.16829v1> (Year: 2024).*

Gadelmawla et al. Roughness Parameters [Online]. Apr. 10, 2002 [Retrieved on Dec. 22, 2025]. Retrieved from the Internet: <URL: https://www.sciencedirect.com/science/article/pii/S0924013602000602 > (Year: 2002).*

Bavitha et al. Color Identification [Online]. 2021 [Retrieved on Dec. 22, 2025]. Retrieved from the Internet: <URL: https://ece.anits.edu.in/Project%20Reports%202020-21%20modified/Sec-A/A-4.pdf> (Year: 2021).*

TurboSquid3DResources. Diffuse/Specular . . . [Online]. Oct. 2023[WaybackMachine. Retrieved on Dec. 22, 2025]. Retrieved from the Internet:<URL: https://resources.turbosquid.com/stemcell/stemcell-3d-modeling-workflow/stemcell-textures-materials/stemcell-textures-materials-v1/diffuse-specular-vs-basecolor/> (Year: 2023).*

(Continued)

*Primary Examiner* — King Y Poon
*Assistant Examiner* — Michelle Hau Ma
(74) *Attorney, Agent, or Firm* — Nutter McClennen & Fish LLP

(57) ABSTRACT

Illustrative embodiments generate a physical base rendering (PBR) palette that provides improved fidelity in images rendered by a computer aided design system. For example, where a CAD system operator has a basic shading palette for an existing design, and where the CAD system operator desires to generate images of the existing design from a PBR palette instead, illustrative embodiments process the basic shading palette to produce a PBR palette that, when used by the CAD system to render an image, produces an image of a higher quality than conventional technologies.

24 Claims, 18 Drawing Sheets
(7 of 18 Drawing Sheet(s) Filed in Color)

(56) References Cited

OTHER PUBLICATIONS

Admesy. Using Color Wheels and Color Spaces to Describe Light [Online]. Mar. 13, 2018 [Retrieved on Dec. 22, 2025]. Retrieved from the Internet: <URL: https://www.azom.com/article.aspx?ArticleID=14974 > (Year: 2018).*

Durmus et al. Evaluation of Hue Shift Formulae in Cielab and CAM02 [Online]. Jun. 14, 2019 [Retrieved on Dec. 23, 2025]. Retrieved from the Internet: <URL: https://files.cie.co.at/x046_2019/x046-PO005.pdf > (Year: 2019).*

Hobart and William Smith Colleges. Introduction to Lighting [Online]. Nov. 4, 2020 [Date from Wayback Machine. Retrieved on Dec. 23, 2025]. Retrieved from the Internet: <URL: https://math.hws.edu/graphicsbook/c4/s1.html > (Year: 2020).*

Pai, Hong-Yi. Texture designs and workflows for physically based rendering using procedural texture generation [Online]. Oct. 2019 [Retrieved on Apr. 22, 2026]. Retrieved from the Internet: <URL: https://ieeexplore.ieee.org/abstract/document/8942651 > (Year: 2019).*

Leon Eversberg et al, “Generating Images with Physics-Based Rendering for an Industrial Object Detection Task: Realism versus Domain Randomization”, Sensors, vol. 21, No. 23, Nov. 26, 2021.

International Search Report and Written Opinion for International Application No. PCT/US2025/027530, mailed Jul. 29, 2025, 16 pages.

Ye Fang et al, “Make-it-Real: Unleashing Large Multimodal Model’s Ability for Painting 3D Objects with Realistic Materials”, ArXiv.Org, Cornell University Library, 201 Olin Library Cornell University Ithaca, NY 14853, Apr. 25, 2024.

Zeyu Li et al, “MaterialSeg3D: Segmenting Dense Materials from 2D Priors for 3D Assets”, ArXiv.Org, Cornell University Library, 201 Olin Library Cornell University Ithaca, NY 14853, Apr. 22, 2024.

Wikimedia Commons, File: HSL color solid dblcone.png, Dec. 28, 2015, online: retrieved Mar. 28, 2026, 3 pages.

* cited by examiner

Figure 6:
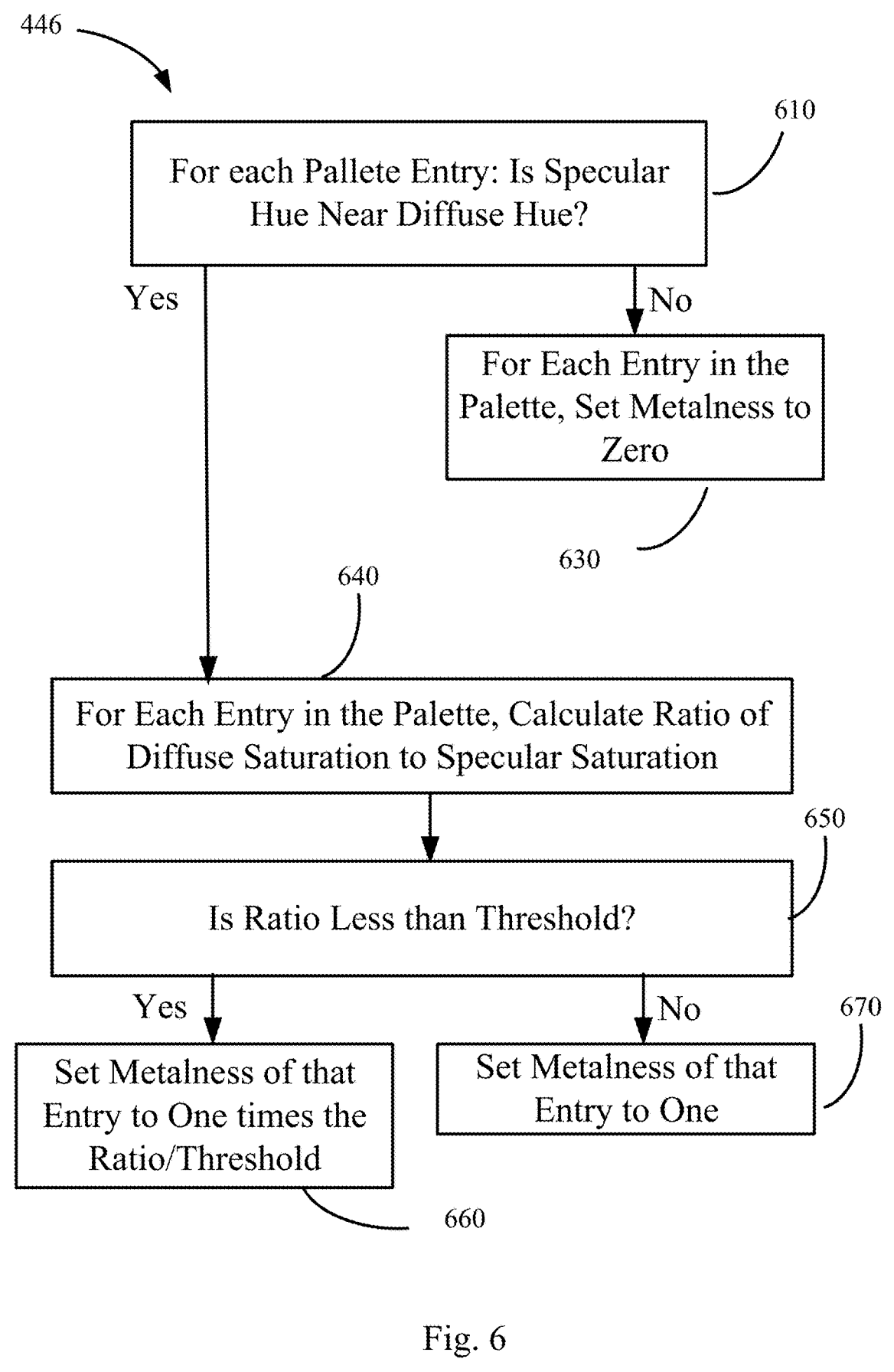

446

610
For each Pallete Entry: Is Specular Hue Near Diffuse Hue?

Yes

No

For Each Entry in the Palette, Set Metalness to Zero

630

640

For Each Entry in the Palette, Calculate Ratio of Diffuse Saturation to Specular Saturation

650

Is Ratio Less than Threshold?

Yes

No

670

Set Metalness of that Entry to One times the Ratio/Threshold

Set Metalness of that Entry to One

SYSTEMS AND METHOD FOR PHYSICALLY BASED RENDERING

TECHNICAL FIELD

Embodiments generally relate to computer aided design and, more particularly, embodiments relate to rendering images.

BACKGROUND ART

Computer-aided design ("CAD") systems render images of objects, and typically render such images in a 3D format.

CAD systems typically render an object (or system having a plurality of objects) by illuminating the object with incident light in a simulated environment. The appearance of the rendered object may depend on several factors, including for example the color of the incident light and properties of the surface of the object, such as the color of the surface of the object, and the roughness of the surface of the object. Objects in an image typically have a color and a degree of shine (or "shininess"), depending for example on the object's constituent materials.

In general, an object's surface can be classified as either being "metal" or "ceramic." Metals tend to reflect light as a version of its base color, while ceramics tend to reflect the actual color of the light. The rendered color of incident light bounced off of a ceramic object will be based on the color of the incident light. In contrast, the rendered color of incident light bounced off of a metal object will be influenced by the characteristics of the surface of the metal object, including for example the color of the metal object, and the texture of the metal object.

Improvements to visualization quality is a continuous pursuit.

Conventional CAD systems store a palette having a set of entries, each entry corresponds to one or more objects in the CAD model, with the array or collection being only material definitions needed to render a 3D model at any one time. A palette is typically managed as an array where each object to be drawn would reference its material by index.

A computer-aided design ("CAD") image to be rendered by a CAD system typically includes a set of virtual objects. Each virtual object represents a physical object in, or to be constructed in, the real world, in which each physical object is comprised of a corresponding physical material. For example, a factory might have a floor object comprised of concrete, and pipe objects comprised of steel, and light fixture objects comprised of aluminum.

Each virtual object in the CAD image has a corresponding palette entry which includes a dataset that describes, to the CAD system, the virtual object, and how the virtual object reacts to light.

In general, CAD systems store CAD drawing color details using red, green and blue ("RGB") data. This may be referred-to as the "RGB" color model.

Computer-aided design methods and systems render each virtual object in a CAD image by operating on the dataset corresponding to the virtual object. Collectively, the virtual objects form the rendered CAD image.

Historically, CAD methods and system employ a rendering technique commonly referred-to as "basic" shading. Basic shading is historically the default way of performing the surface rendering using OpenGL, an industry standard library supported by all major PC operating system providers. However, images rendered from basic shading data have undesirable shortcomings, including a lack of fidelity in color and reflectiveness.

An alternative representation of the RGB (i.e., Red, Green, Blue) color model is the Hue, Saturation, Value model (or "HSV" model).

Other CAD systems use a technique known as "physical base rendering" or "physically based rendering" ("PBR"), which is a method of rendering that provides a more accurate representation of how light interacts with materials. PBR is considered an improvement over the conventional basic shading approach. Some CAD drawings, however, were not created using "physical base rendering," and so modern systems that can execute "physical base rendering" cannot render such CAD drawings using "physical base rendering" due to the absence of a PBR palette for the CAD drawing. However, images rendered from a conventional PBR palette may also have shortcomings. For example, images of different metal surfaces rendered from a PBR palette may appear to indicate that the metal surfaces have different material properties (e.g., color; shininess) even when those properties should be consistent between the surfaces.

SUMMARY OF VARIOUS EMBODIMENTS

A first embodiment includes a method of rendering an image, in which the method includes creating a physically based rendering palette from a basic palette. The method includes obtaining a model for a computer-aided-design environment, the model including a plurality of materials and not including a physically based rendering palette. The method also includes obtaining a basic palette corresponding to the model, the basic palette including a plurality of basic palette entries, and obtaining an H-S palette corresponding to the model, the H-S palette including a plurality of H-S entries, each H-S entry corresponding to a one of the basic palette entries, and including a corresponding hue parameter and a corresponding saturation parameter.

The method further includes finding, from the plurality of basic palette entries, the minimum finish value and the maximum finish value.

The method also includes creating, from the basic palette and the H-S palette, a physically based rendering ("PBR") palette for the model, in which the PBR palette includes a plurality of PBR palette entries, each PBR entry corresponding to a one of the basic palette entries of the basic palette. Creating that PBR palette includes, for each PBR palette entry:

- setting the color value of the PBR palette to a color selected from the specular color of the corresponding basic palette entry and the diffuse color of the basic palette entry;
- setting a metalness parameter by assessing the specular hue and the diffuse hue from the corresponding H-S palette;
- setting a roughness parameter based on the smallest finish value of the basic palette and the greatest finish value of the basic palette; and
- rendering an image from the PBR palette.

In some embodiments, the H-S palette includes a palette in the Hue, Saturation, Value format. In some embodiments, the H-S palette includes a palette in the Hue, Saturation, Lightness format.

In some embodiments, obtaining an H-S palette corresponding to the model includes converting the basic palette to the H-S palette.

In some embodiments, setting a metalness parameter by assessing the specular hue and the diffuse hue from the corresponding H-S palette includes:

for each entry in which the specular hue is not near the diffuse hue, setting the metalness parameter to a value of zero; and for each entry in which the specular hue is near the diffuse hue, and for which a ratio of diffuse saturation to specular saturation is not less than a predetermined diffuse/saturation threshold, setting the metalness parameter to a value of one; and for each entry in which the specular hue is near the diffuse hue, and for which a ratio of diffuse saturation to specular saturation is less than the predetermined diffuse/saturation threshold, setting the metalness parameter to a value of the ratio of diffuse saturation to specular saturation.

In some embodiments, setting a metalness parameter by assessing the specular hue and the diffuse hue from the corresponding H-S palette includes:

categorizing the PBR entry into one of a set of categories, and setting the metalness to a metalness value corresponding to the category, wherein the categories are selected from: (a) a category for situations in which the specular hue is not near the diffuse hue, and the corresponding metalness value is zero; (b) a category for situations in which the specular hue is near the diffuse hue and the ratio of diffuse saturation to specular saturation is less than a threshold, and the corresponding metalness value is the ratio divided by the threshold; and (c) a category for situations in which the specular hue is not near the diffuse hue and the ratio of diffuse saturation to specular saturation is not less than the threshold, and the corresponding metalness value is one.

In some embodiments, setting the roughness parameter includes determining, from among the finish values of the basic palette, the smallest finish value of the basic palette; subtracting said minimum finish value of the basic palette; determining, from among the finish values of the basic palette, the greatest finish value of the basic palette; determining the difference between greatest finish value of the basic palette from the smallest finish value of the basic palette; setting the roughness parameter to according to the formula: roughness=(1−smallest finish value)/(greatest finish value−smallest finish value).

Another embodiment includes a system, in which the system includes: a memory to store a CAD model to be rendered, the CAD model having a plurality of materials; and a basic palette corresponding to the CAD model, the basic palette having a plurality of basic palette entries, each basic palette entry of the plurality of basic palette entries corresponding to a corresponding material from the plurality of materials; and an H-S palette corresponding to the CAD model, the H-S having a plurality of H-S palette entries, each H-S palette entry of the plurality of H-S palette entries corresponding to a corresponding material from the plurality of materials.

The system also includes a set of modules configured to generate a set of PBR palette entries in a PBR palette corresponding to the CAD model, each PBR palette entry of the plurality of PBR palette entries corresponding to a corresponding material from the plurality of materials.

The set of modules includes: a color determination module configured to determine, for each PBR palette entry, a color parameter; a metalness module configured to determine, for each PBR palette entry, a metalness parameter; a roughness module configured to determine, for each PBR palette entry, a roughness parameter; and an image generation module configured to generate an image of the CAD model from the PBR palette.

Some system embodiments also include a transformation module configured to generate the H-S palette from the basic palette.

In some system embodiments, the color determination module is configured to determine, for each PBR palette entry, a color parameter by: setting the color value of the PBR palette to a color selected from the specular color of the corresponding basic palette entry and the diffuse color of the basic palette entry.

In some system embodiments, the metalness module is configured to determine, for each PBR palette entry, a metalness parameter by:

for each entry in which the specular hue is not near the diffuse hue, setting the metalness parameter to a value of zero; and for each entry in which the specular hue is near the diffuse hue, and for which a ratio of diffuse saturation to specular saturation is not less than a predetermined diffuse/saturation threshold, setting the metalness parameter to a value of one; and for each entry in which the specular hue is near the diffuse hue, and for which a ratio of diffuse saturation to specular saturation is less than the predetermined diffuse/saturation threshold, setting the metalness parameter to a value of the ratio of diffuse saturation to specular saturation.

In some system embodiments, the metalness module is configured to determine, for each PBR palette entry, a metalness parameter by:

categorizing the PBR entry into one of a set of categories, and setting the metalness to a metalness value corresponding to the category, wherein the categories are selected from:

(a) a category for situations in which the specular hue is not near the diffuse hue, and the corresponding metalness value is zero;

(b) a category for situations in which the specular hue is near the diffuse hue and the ratio of diffuse saturation to specular saturation is less than a threshold, and the corresponding metalness value is the ratio divided by the threshold; and (c) a category for situations in which the specular hue is not near the diffuse hue and the ratio of diffuse saturation to specular saturation is not less than the threshold, and the corresponding metalness value is one.

In some system embodiments, the roughness module is configured to determine, for each PBR palette entry, a roughness parameter by:

determining, from among the finish values of the basic palette, the smallest finish value of the basic palette;

subtracting said minimum finish value of the basic palette;

determining, from among the finish values of the basic palette, the greatest finish value of the basic palette;

determining the difference between greatest finish value of the basic palette from the smallest finish value of the basic palette;

setting the roughness parameter to according to the formula:

$$\text{roughness} = (1 - \text{smallest finish value})/(\text{greatest finish value} - \text{smallest finish value}).$$

Yet another embodiment includes a non-transitory computer readable medium having computer-executable code therein, the computer executable code, when executed by a computer, causes the computer to perform a method, in which the method includes obtaining a model for a computer-aided-design environment, the model including a plurality of materials; obtaining a basic palette corresponding to the model, the basic palette including a plurality of basic palette entries, each basic palette entry of the plurality of basic palette entries corresponding to a material from the plurality of materials and having a corresponding finish value; obtaining an H-S palette corresponding to the model, the H-S palette including a plurality of H-S entries, each H-S entry corresponding to a one of the basic palette entries, and including a corresponding hue parameter and a corresponding saturation parameter; and finding, from the plurality of basic palette entries, the minimum finish value and the maximum finish value.

That method also includes creating, from the basic palette and the H-S palette, a physically based rendering ("PBR") palette for the model, the PBR palette including a plurality of PBR palette entries, each PBR entry corresponding to a one of the basic palette entries of the basic palette, by, for each PBR palette entry:

- setting the color value of the PBR palette to a color selected from the specular color of the corresponding basic palette entry and the diffuse color of the basic palette entry;
- setting a metalness parameter by assessing the specular hue and the diffuse hue from the corresponding H-S palette;
- setting a roughness parameter based on the smallest finish value of the basic palette and the greatest finish value of the basic palette; and
- rendering the image from the PBR palette.

In some embodiments, the H-S palette includes a palette in the Hue, Saturation, Value format.

In some embodiments, setting a metalness parameter by assessing the specular hue and the diffuse hue from the corresponding H-S palette includes:

- for each entry in which the specular hue is not near the diffuse hue, setting the metalness parameter to a value of zero; and
- for each entry in which the specular hue is near the diffuse hue, and for which a ratio of diffuse saturation to specular saturation is not less than a predetermined diffuse/saturation threshold, setting the metalness parameter to a value of one; and
- for each entry in which the specular hue is near the diffuse hue, and for which a ratio of diffuse saturation to specular saturation is less than the predetermined diffuse/saturation threshold, setting the metalness parameter to a value of the ratio of diffuse saturation to specular saturation.

In some embodiments, obtaining an H-S palette corresponding to the model includes converting the basic palette to the H-S palette.

In some embodiments, setting a metalness parameter by assessing the specular hue and the diffuse hue from the corresponding H-S palette includes categorizing the PBR entry into one of a set of categories, and setting the metalness to a metalness value corresponding to the category, wherein the categories are selected from:

(a) a category for situations in which the specular hue is not near the diffuse hue, and the corresponding metalness value is zero;

(b) a category for situations in which the specular hue is near the diffuse hue and the ratio of diffuse saturation to specular saturation is less than a threshold, and the corresponding metalness value is the ratio divided by the threshold; and (c) a category for situations in which the specular hue is not near the diffuse hue and the ratio of diffuse saturation to specular saturation is not less than the threshold, and the corresponding metalness value is one.

In some embodiments, setting the roughness parameter includes: determining, from among the finish values of the basic palette, the smallest finish value of the basic palette; subtracting said minimum finish value of the basic palette; determining, from among the finish values of the basic palette, the greatest finish value of the basic palette; determining the difference between greatest finish value of the basic palette from the smallest finish value of the basic palette; setting the roughness parameter to according to the formula: roughness=(1−smallest finish value)/(greatest finish value−smallest finish value).

BRIEF DESCRIPTION OF THE DRAWINGS

The patent or application file contains at least one drawing executed in color. Copies of this patent or patent application publication with color drawing(s) will be provided by the Office upon request and payment of the necessary fee.

Those skilled in the art should more fully appreciate advantages of various embodiments from the following "Description of Illustrative Embodiments," discussed with reference to the drawings summarized immediately below.

FIG. 6 is a flowchart of an embodiment of a method of specifying metalness of a PBR palette entry;

DESCRIPTION OF ILLUSTRATIVE EMBODIMENTS

Figure 1A:
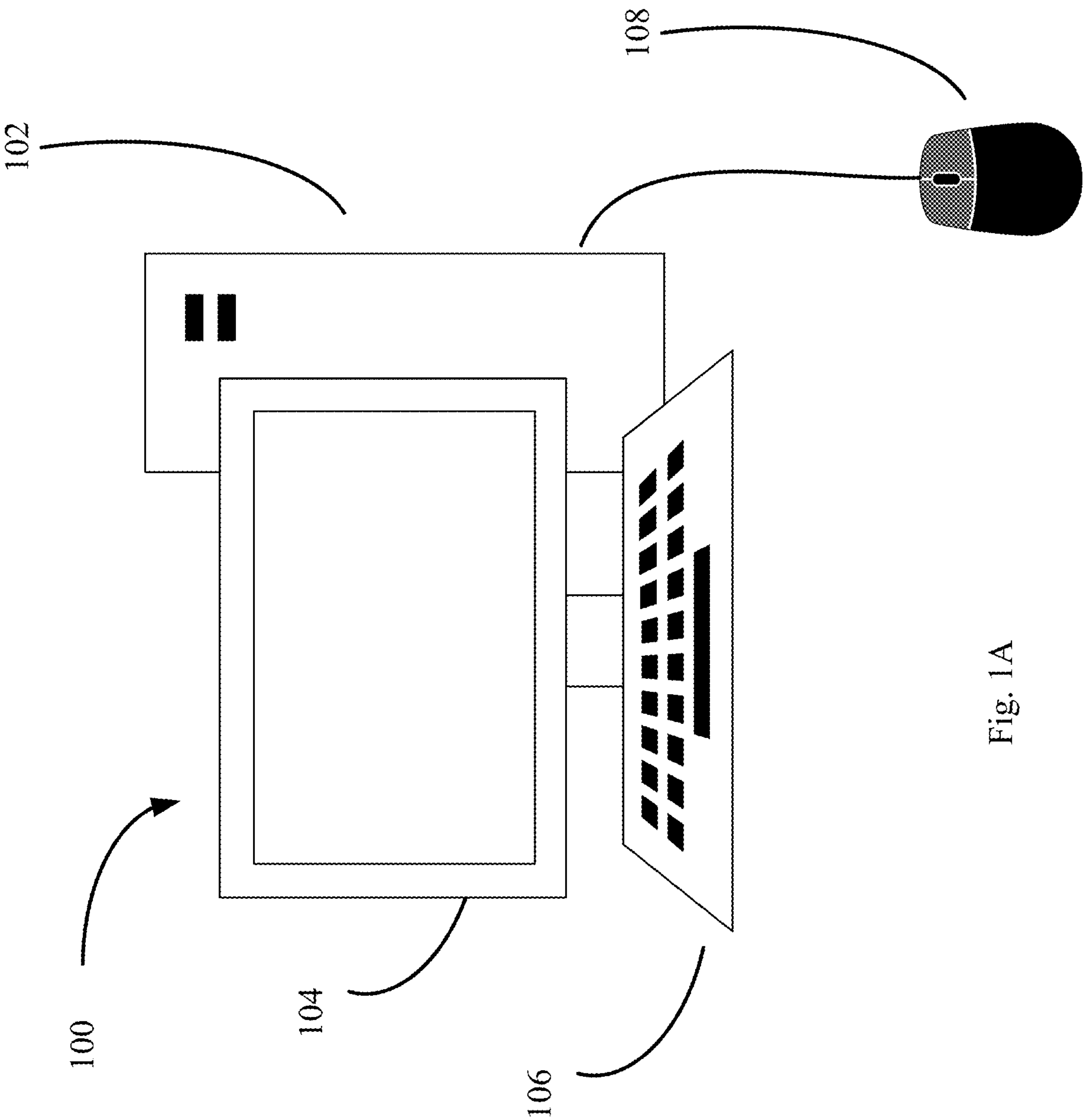
FIG. 1A schematically illustrates a system according to illustrative embodiments.

Illustrative embodiments arise in the field of computer-based image rendering in which a computer generates an image on a computer screen, in which the image is based on data in a palette. Such as in operations may be performed by a CAD computer or system, to name but one example.

Illustrative embodiments generate a physical base rendering (PBR) palette that provides improved fidelity in images rendered by a computer aided design system. For example, where a CAD system operator has a basic shading palette for an existing design, and where the CAD system operator desires to generate images of the existing design from a PBR palette instead, illustrative embodiments process the basic shading palette to produce a PBR palette that, when used by the CAD system to render an image, produces an image of a higher quality than conventional technologies.

Illustrative embodiments improve visual results and also serve to reduce the burden on the user to manually build useful PBR material palettes. Illustrative embodiments disclose the automation of material creation process. Conventional methods of creating and using a PBR palette put the burden on designers to create and apply PBR materials to their models. There are techniques for creating PBR materials from images, but the intended look must first be achieved (or a picture that illustrates that look) for a PBR material to be captured. A transfer of color from one system to another is inadequate to take full advantage of PBR, but by looking at the pre-defined engineering materials to automatically create PBR materials, better automation in the presentation of models is achieved.

Illustrative embodiments enable a CAD system to render a CAD image using "physical base rendering" ("PBR") even where that available image data does not include a PBR palette. For example, the ability to create and use a PBR palette may be important when a user has an image having an associated palette that is not a PBR palette (e.g., a basic palette or an HSV palette) but has software than cannot operate on the palette associated with the image, or a palette that is not a PBR palette.

Definitions: As used in this description and the accompanying claims, the following terms shall have the meanings indicated, unless the context otherwise requires.

The term "CAD" means "computer-aided design."

The term "H-S palette" means a palette in which each palette entry comprises a corresponding hue parameter and a corresponding saturation parameter. Examples of H-S palettes include, for example, an HSV palette and an HSL palette.

The term "PBR" means "physical base rendering" or "physically based rendering."

The term "palette" means an array or collection of material definitions that the system applies to a CAD model that is to be rendered at any one time. Typically, a palette has one entry corresponding to each material included in a CAD model.

A "set" includes at least one member.

Conventional CAD systems were unable to render a CAD image using "physical base rendering" unless the CAD systems were provided with a PBR palette corresponding to the CAD image. Illustrative embodiments enable a CAD system to render a CAD image using "physical base rendering" even in situations in which that available image data does not include a PBR palette. Consequently, illustrative embodiments represent an improvement over previous CAD systems in that such embodiment enable a CAD system to render an image using a PBR palette even when the CAD model from which the image is created does not have a corresponding PBR palette.

Illustrative embodiments consume data from a basic palette corresponding to an image to be rendered, and consume data from an H-S palette corresponding to the image to be rendered, to produce a PBR palette for the image to be rendered.

FIG. 1A schematically illustrates a system 100 according to illustrative embodiments. The system 100 includes a processing unit 102 in electronic communication with a computer display having a display screen 104, and a computer keyboard 106, and a computer mouse 108.

Figure 1B:
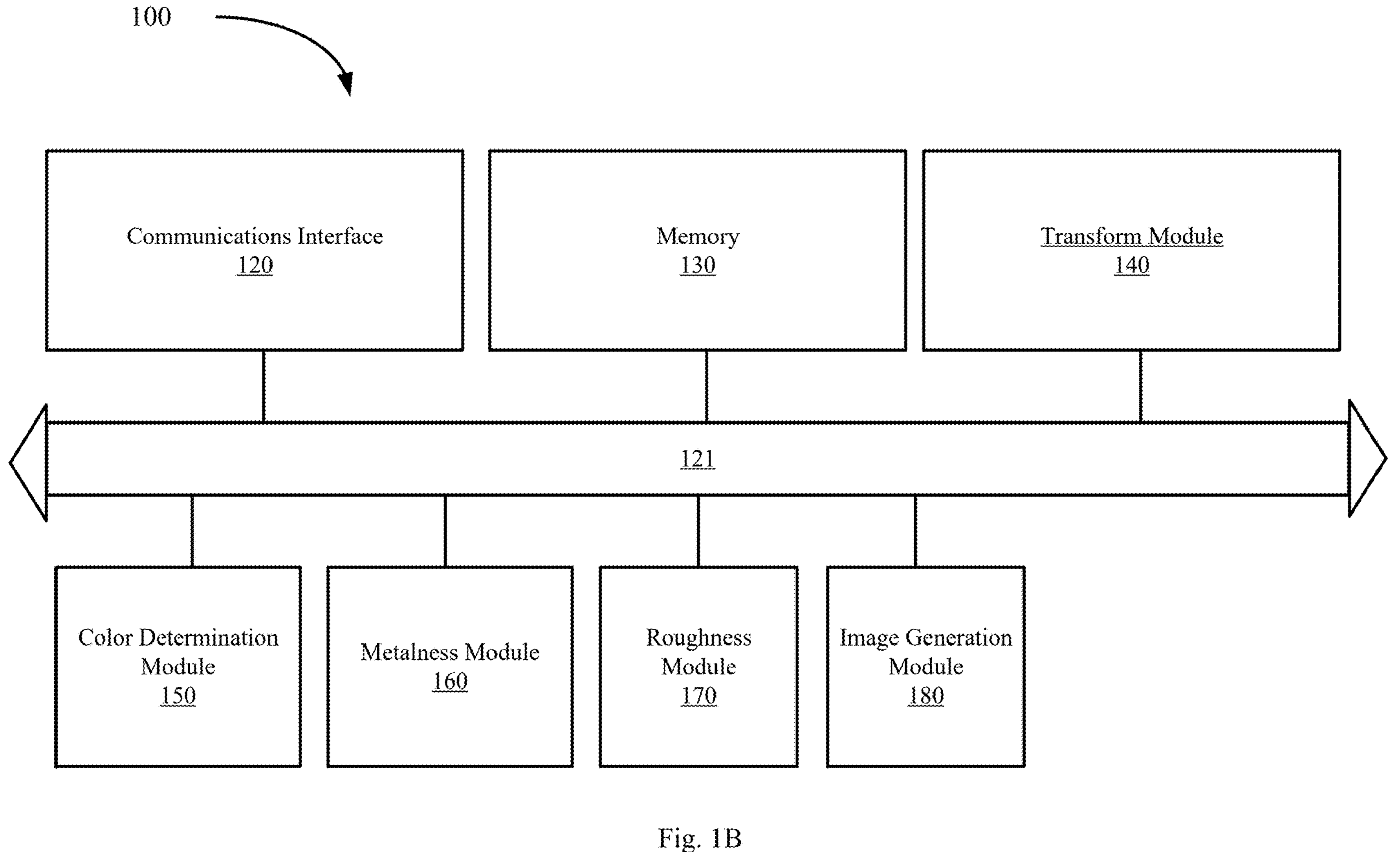
FIG. 1B schematically illustrates modules of a system according to illustrative embodiments.

FIG. 1B schematically illustrates modules of a system 100 according to illustrative embodiments. The system modules are in data communication with one another via data bus 121, and include a communication interface 120, a computer memory 130, a transform module 140, a color determination module 150, a metalness module 160, and a roughness module 170.

The system modules also include an image generation module 180, which is configured to render a CAD image from a PBR palette.

Figure 1C:
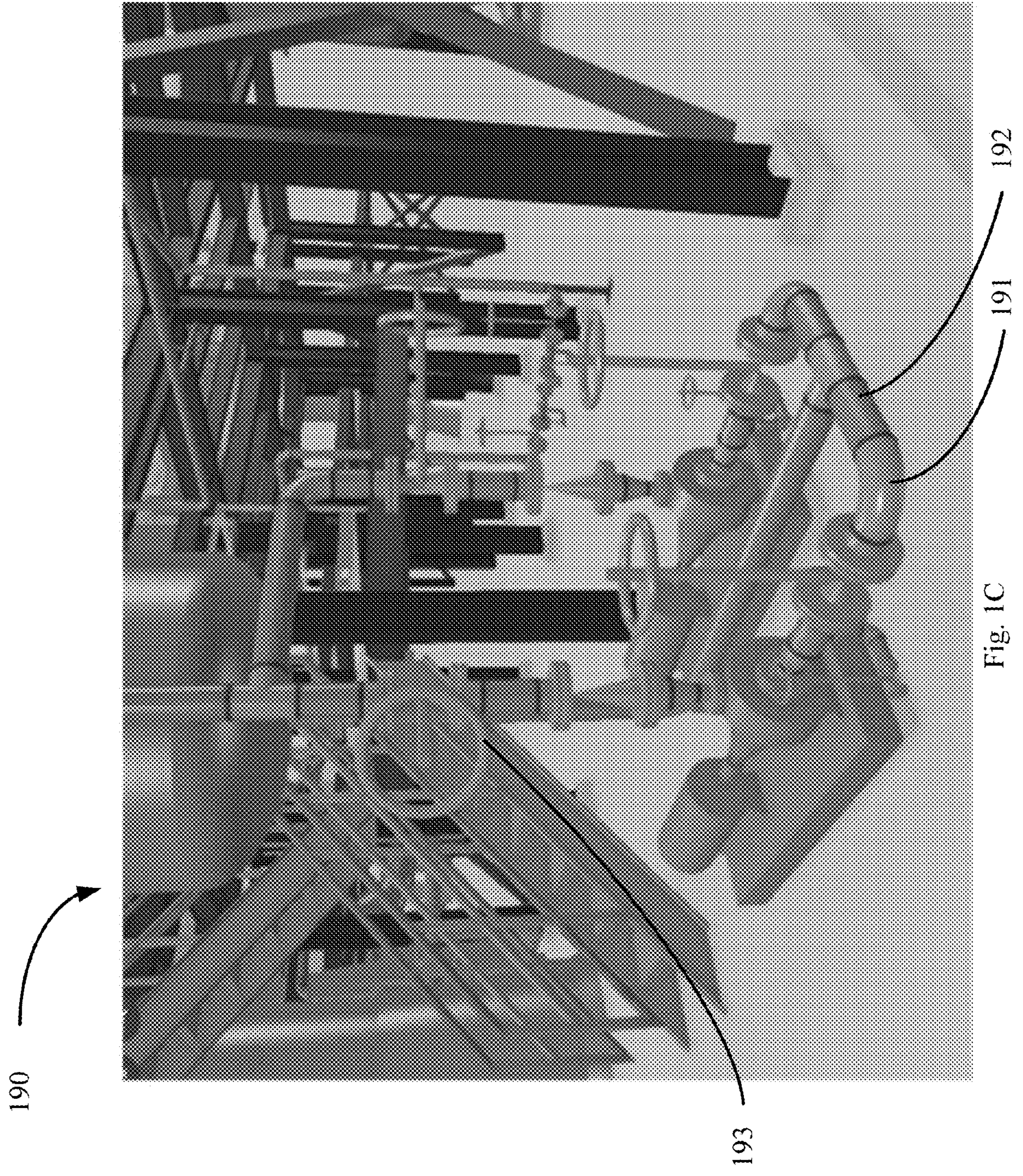
FIG. 1C is an embodiment of a CAD image according rendered using a conventional basic palette.
Figure 1D:
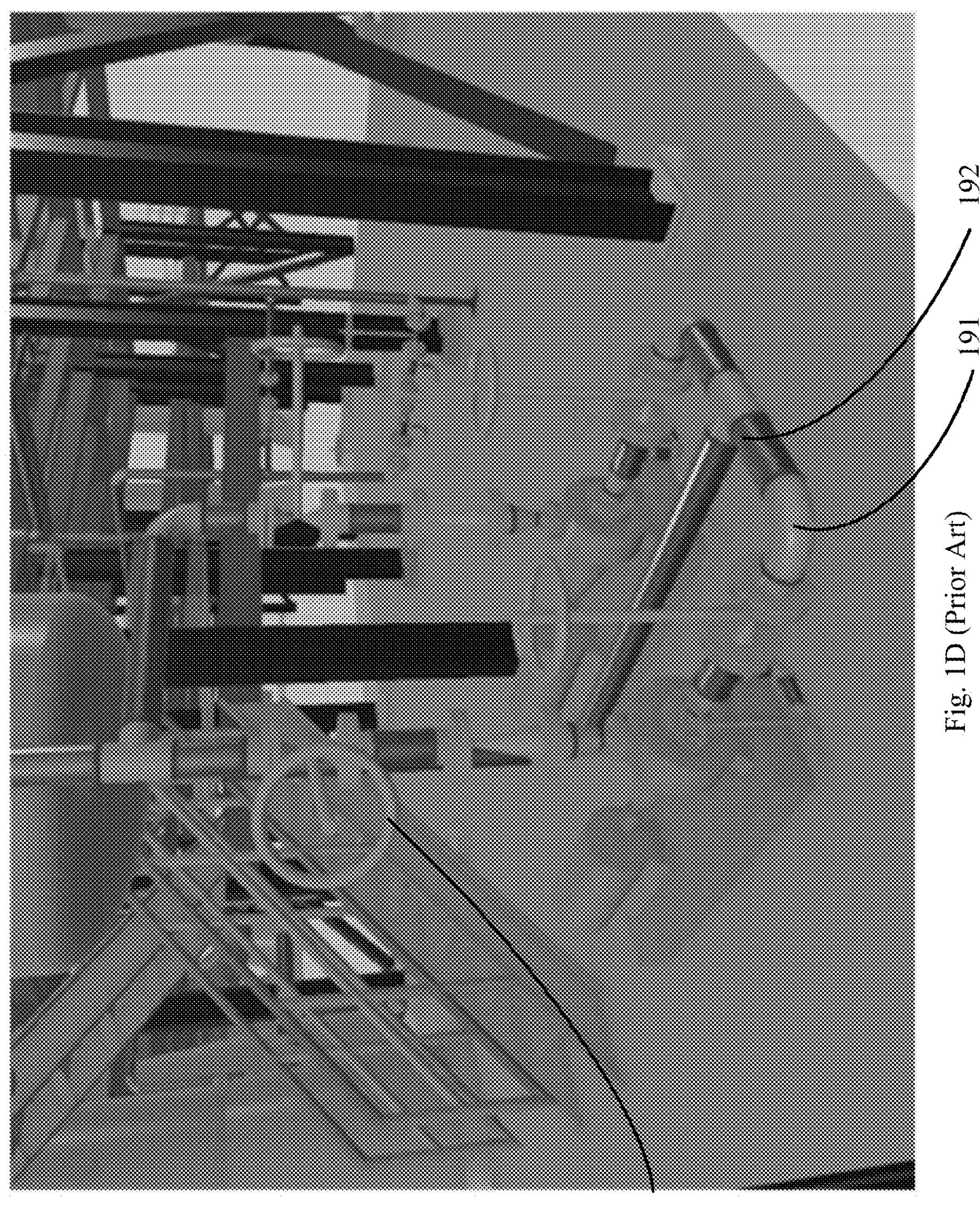
FIG. 1D is an embodiment of a CAD image rendered using a conventional PBR palette.
Figure 1E:
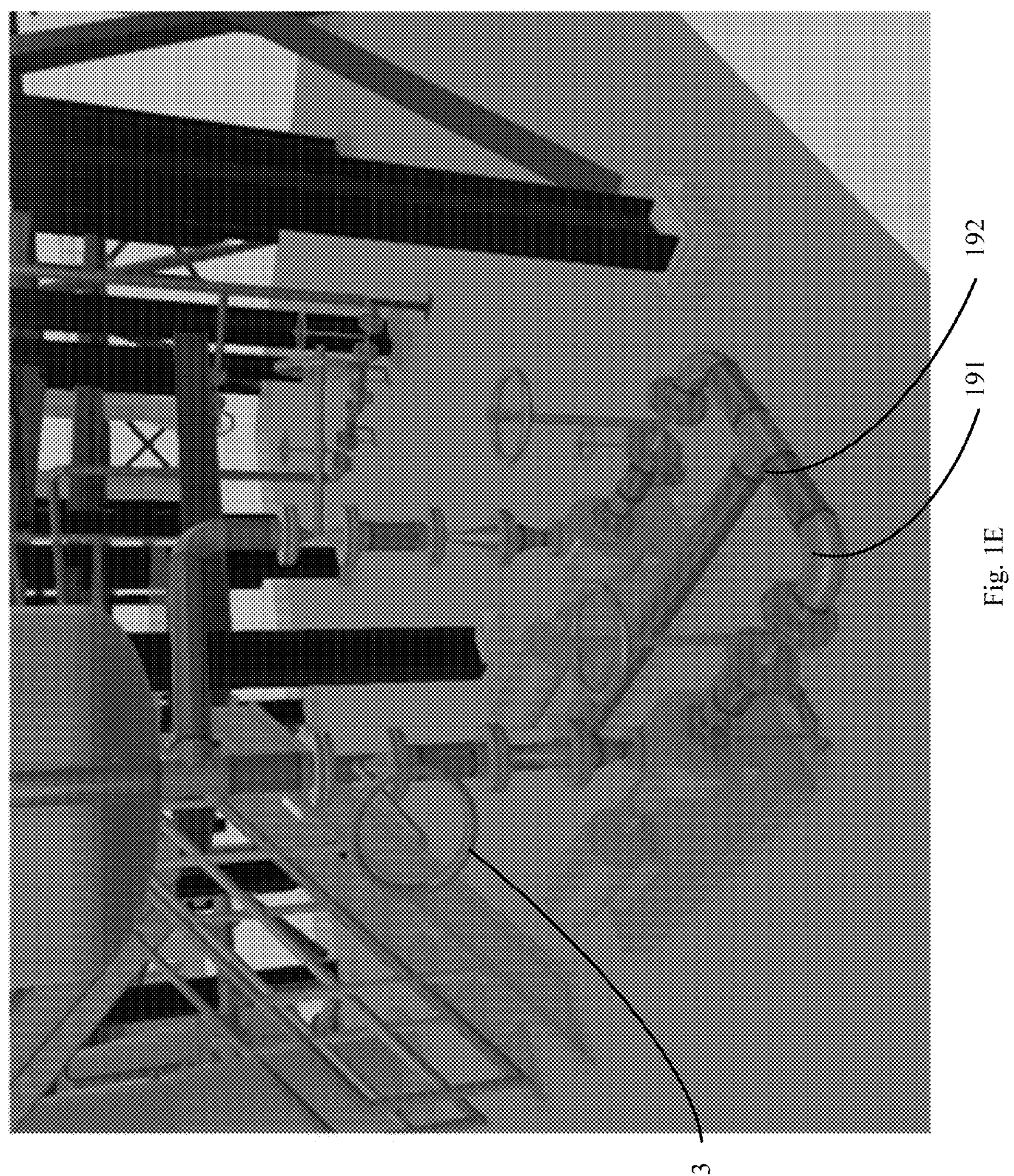
FIG. 1E is an embodiment of a CAD image rendered using a PBR palette generated according to various embodiments disclosed herein.

FIG. 1C, FIG. 1D and FIG. 1E schematically illustrate a CAD image 190 rendered, respectively, using a conventional basic palette, and a conventional PBR palette, and a PBR palette generated according to various embodiments described herein. In this example, the H-S palette is an HSV palette. The image 190 includes several virtual objects, including without limitation a metal pipe elbow 191, a metal pipe segment 192, and a valve wheel 193. Ideally, the metal pipe elbow 191 and the metal pipe segment 192 would have a same shininess as one another, and the valve wheel 193 would be shiny.

FIG. 1C is an embodiment of a CAD image 190 rendered using a conventional basic palette. In FIG. 1C, the metal pipe elbow 191 and the metal pipe segment 192 do not have the same shininess as one another (the metal pipe elbow 191 is shinier than the metal pipe segment 192), and the valve wheel 193 is not shiny at all. Note that the shininess of the metal pipes are tied to the specular color and intensity. Ambient light serves little to enhance the view.

FIG. 1D is an embodiment of a CAD image 190 rendered using a conventional PBR palette.

In FIG. 1D, the metal pipe elbow 191 and the metal pipe segment 192 do not have the same shininess as one another (the metal pipe elbow 191 is shinier than the metal pipe segment 192), and the valve wheel 193 is not shiny at all. The image of FIG. 1D appears somewhat random in that pipes and elbows have different material properties, although their metalness should (ideally) be consistent between them. Note also that the valve wheels 193 don't seem to have a metalness to their appearance.

FIG. 1E is an embodiment of a CAD image 190 rendered using a PBR palette generated according to various embodiments disclosed herein.

In FIG. 1E, the metal pipe elbow 191 and the metal pipe segment 192 have the same shininess as one another, and the valve wheel 193 has some shininess. By applying an appropriate amount of metalness, there is a much better presentation of what these components are intended to be made of, overall giving a more realistic result.

Because illustrative embodiments consume data from a basic palette corresponding to an image to be rendered, and consume data from an HSV palette corresponding to the image to be rendered, to produce a PBR palette for the image to be rendered, an overview of basic rendering and the basic palette, and the HSV palette, and the PBR palette is provided below.

Figure 2A:
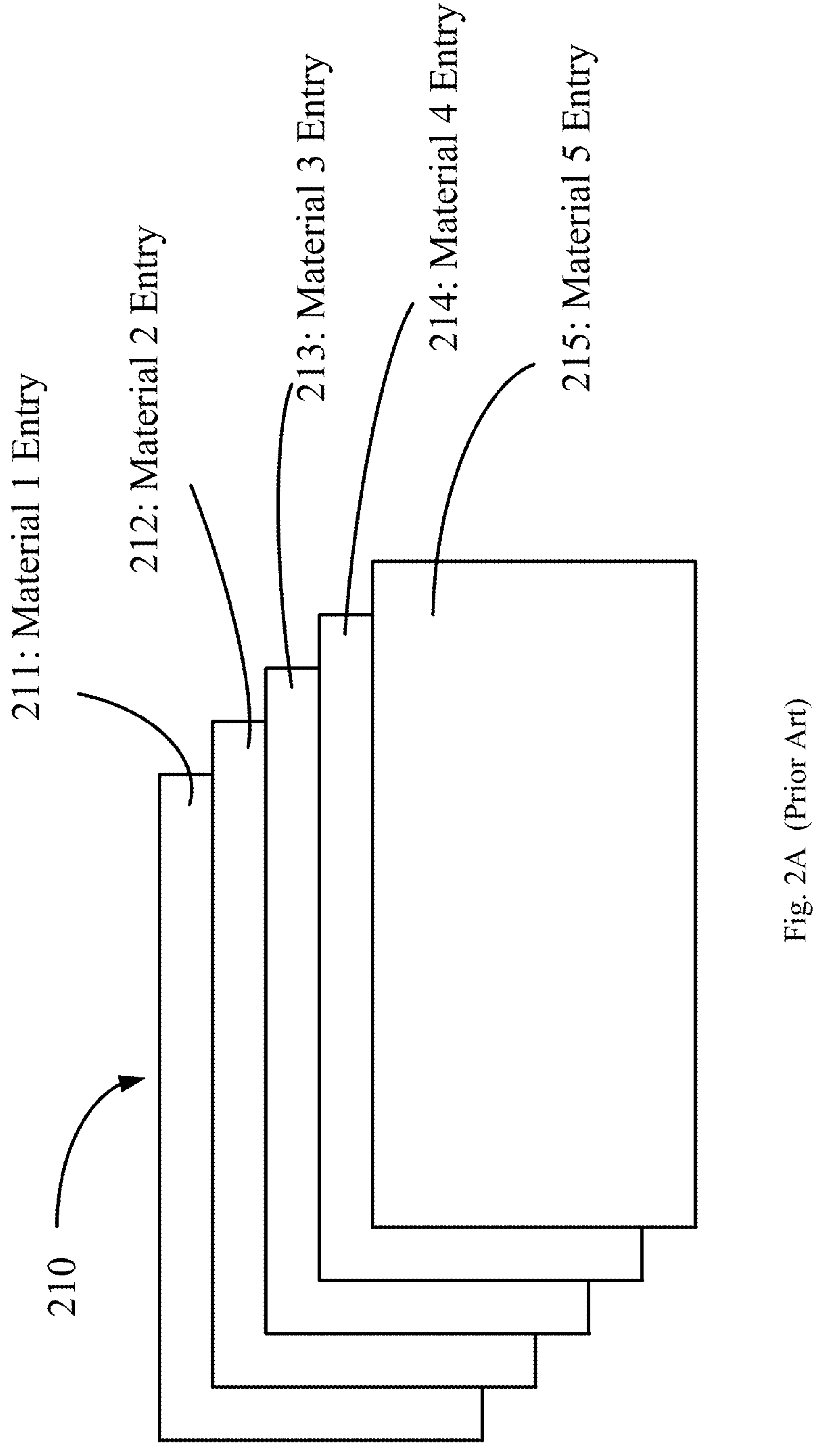
FIG. 2A schematically illustrates an embodiment of a basic palette having a plurality of entries.

Basic Rendering and the Basic Palette (FIG. 2A)

Historically, CAD methods and systems employ a rendering technique commonly referred-to as "basic" shading. Basic shading is historically the default way of performing surface rendering using OpenGL, an industry standard library supported by all major PC operating system providers.

Basic shading employs a palette 210 (referred-to herein as a "basic palette") that includes a set of entries (or pages), as schematically illustrated in FIG. 2A. Each entry corresponds to a physical material from which an object in a CAD image is constructed (e.g., steel, iron, concrete, etc.). The embodiment of basic palette 210 of FIG. 2A has set of entries include a entry 211 for material 1, an entry 212 for material 2, and entry 213 for material 3, an entry 214 for material 4, and an entry 215 for material 5.

In some embodiments, the palette 210 has one entry for each material represented in the CAD image, and no entries for materials not represented in the CAD image, although some embodiments have entries for materials not represented in the CAD image. In illustrative embodiments, each entry in a palette 210 corresponds to a unique corresponding material.

Basic shading employs a set of three colors corresponding to the color that the CAD designer specified for the CAD model. Such colors may be referred-to as designer-specified colors (diffuse, specular, emissive) and surface modifier parameters (finish and shininess) to define the appearance of a surface. More specifically, such conventional rendering techniques use a base color for light reflection (called diffuse color), a color for light sheen reflection that is intended to reflect more light giving the illusion of a polished surface (called specular color), and an emissive color (also known as "ambient" color) used to provide a glow as light bulb or lamp were being rendered.

Consequently, in basic shading, each image to be rendered has a palette that consists of a set of entries, including one entry corresponding to each object (or material from which the object is made) in the image. Each such entry includes the parameters (or values [diffuse value, specular value, emissive value, finish value, and shininess value] that corresponding to that material. In a conventional basic palette, the finish component of an entry, and the shininess component of that entry, each has a single value between zero and one used by the rendering process.

For example, each entry of a basic palette for a given material typically includes the following data:

| Diffuse Data | Specular Data | Emissive Data | Finish Data | Reflection Data |
|---|---|---|---|---|
| Red Diffuse Intensity<br>Green Diffuse Intensity<br>Blue Diffuse Intensity | Red Specular Intensity<br>Green Specular Intensity<br>Blue Specular Intensity | Red Emissive Intensity<br>Green Emissive Intensity<br>Blue Emissive Intensity | Smoothness Intensity | Shininess Intensity |

The red data includes, for the red component, a diffuse color (i.e., which may be referred-to herein as "red diffuse" data), a specular color (i.e., which may be referred-to herein as "red specular" data), and an emissive color (i.e., which may be referred-to herein as "red emissive" data).

The green data includes, for the green component, a diffuse color (i.e., which may be referred-to herein as "green diffuse" data), a specular color (i.e., which may be referred-to herein as "green specular" data), and an emissive color (i.e., which may be referred-to herein as "green emissive" data).

The blue data includes, for the blue component, a diffuse color (i.e., which may be referred-to herein as "blue diffuse" data), a specular color (i.e., which may be referred-to herein as "blue specular" data), and an emissive color (i.e., which may be referred-to herein as "blue emissive" data).

With the advent of OpenGL 2.0, developers were given the option of implementing their own shaders and customizing how the rendering took place. Nevertheless, the standard was still the "basic" shading technique, with enhancements like Phong shading which still uses diffuse, specular, and ambient colors.

Figure 2B:
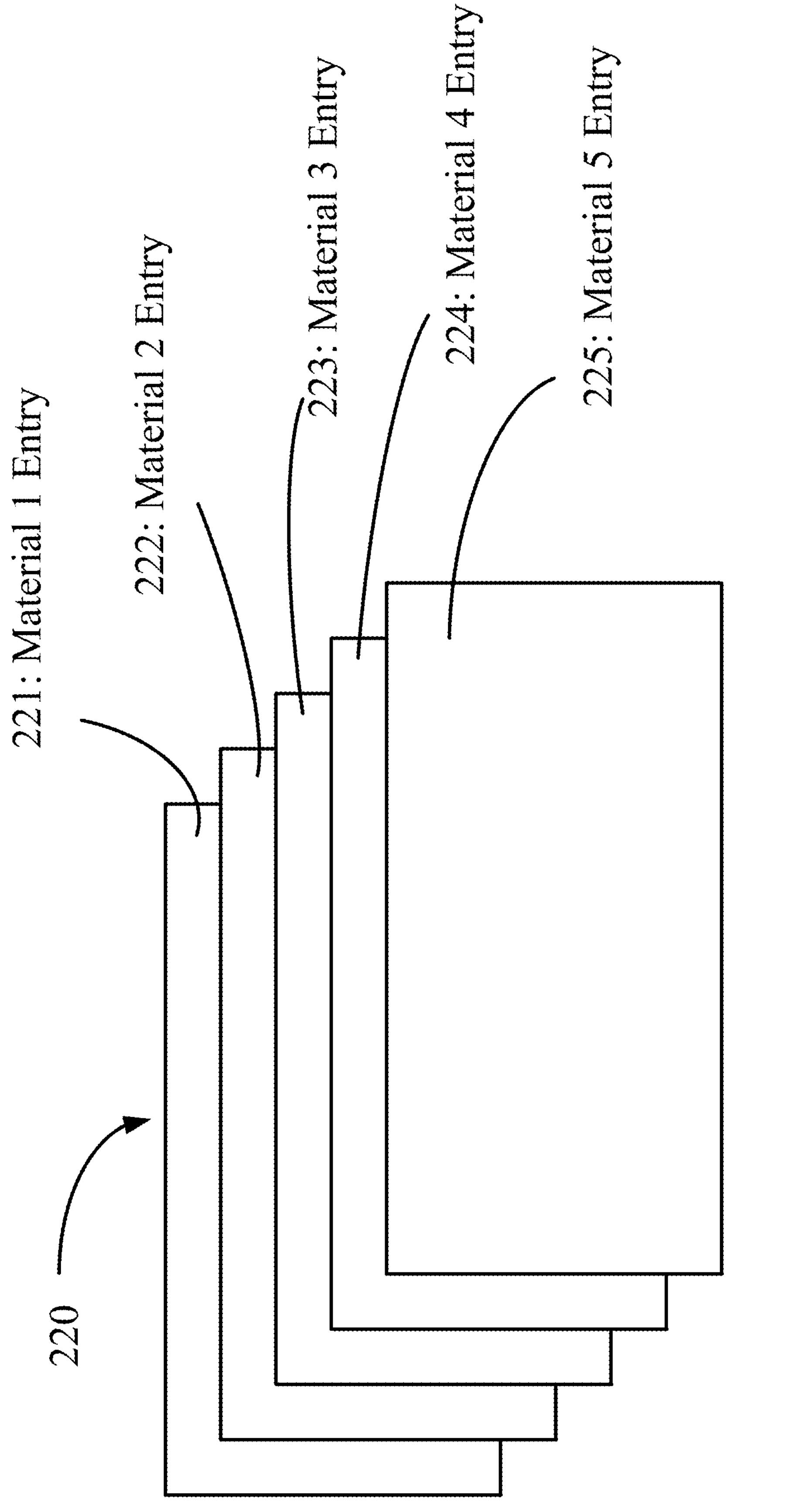
FIG. 2B schematically illustrates an embodiment of an HSV palette having a plurality of entries.

The HSV Palette (FIG. 2B)

An alternative representation of the RGB (i.e., Red, Green, Blue) color model is the Hue, Saturation, Value model (or "HSV" model). Yet another alternative representation of the RGB (i.e., Red, Green, Blue) color model is the Hue, Saturation, Lightness model (or "HSL" model) (FIG. 3D). Each of the Hue, Saturation, Value model and the Hue, Saturation, Lightness model include parameters for Hue and Saturation, and each may be referred-to herein as an "H-S" model.

FIG. 2B schematically illustrates an embodiment of an HSV palette 220 having a plurality of entries (221; 222; 223; 224; 225). Typically, an HSV palette 220 (FIG. 2B) has an entry (or "page") corresponding to each object (or material from which the object is made). Each entry (or page) in the palette of an HSV model includes a value for each of the following parameters:

Hue parameter;

Saturation parameter (where 100% represents fully saturated); and the

Value parameter, which indicates the maximum of the Red, Green, and Blue values (where 100% represents maximum value (or maximum intensity).

For example, an entry of a an HSV palette for a given material typically includes the following data:

| Hue | Saturation | Value |
|---|---|---|
| Hue Parameter (e.g., 0-360 degrees) | Value of Saturation Parameter (e.g., 0-100%) | Value of Value Parameter (e.g., 0-100%) |

Figure 3A:
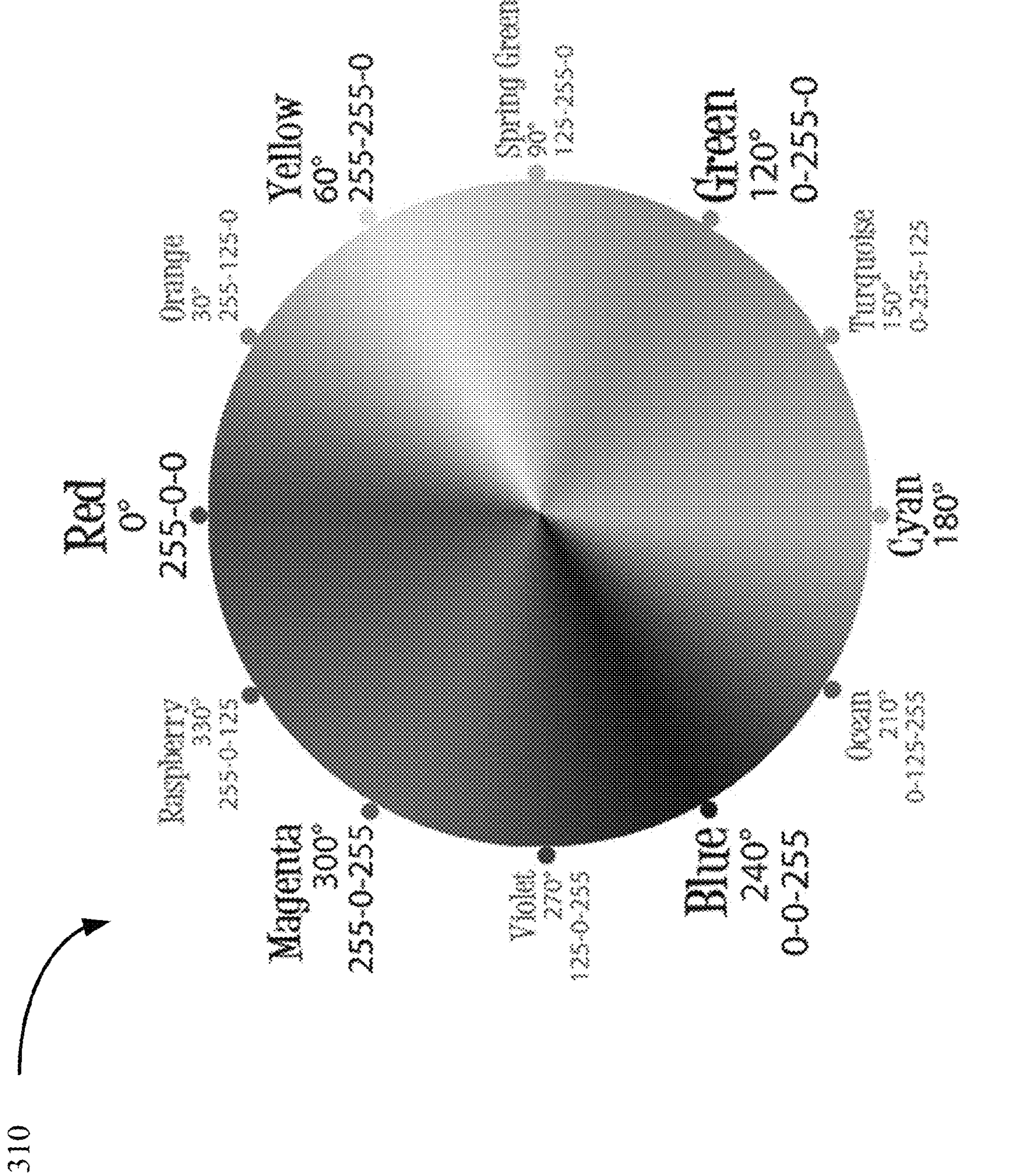
FIG. 3A schematically illustrates an embodiment of a color wheel.
Figure 3B:
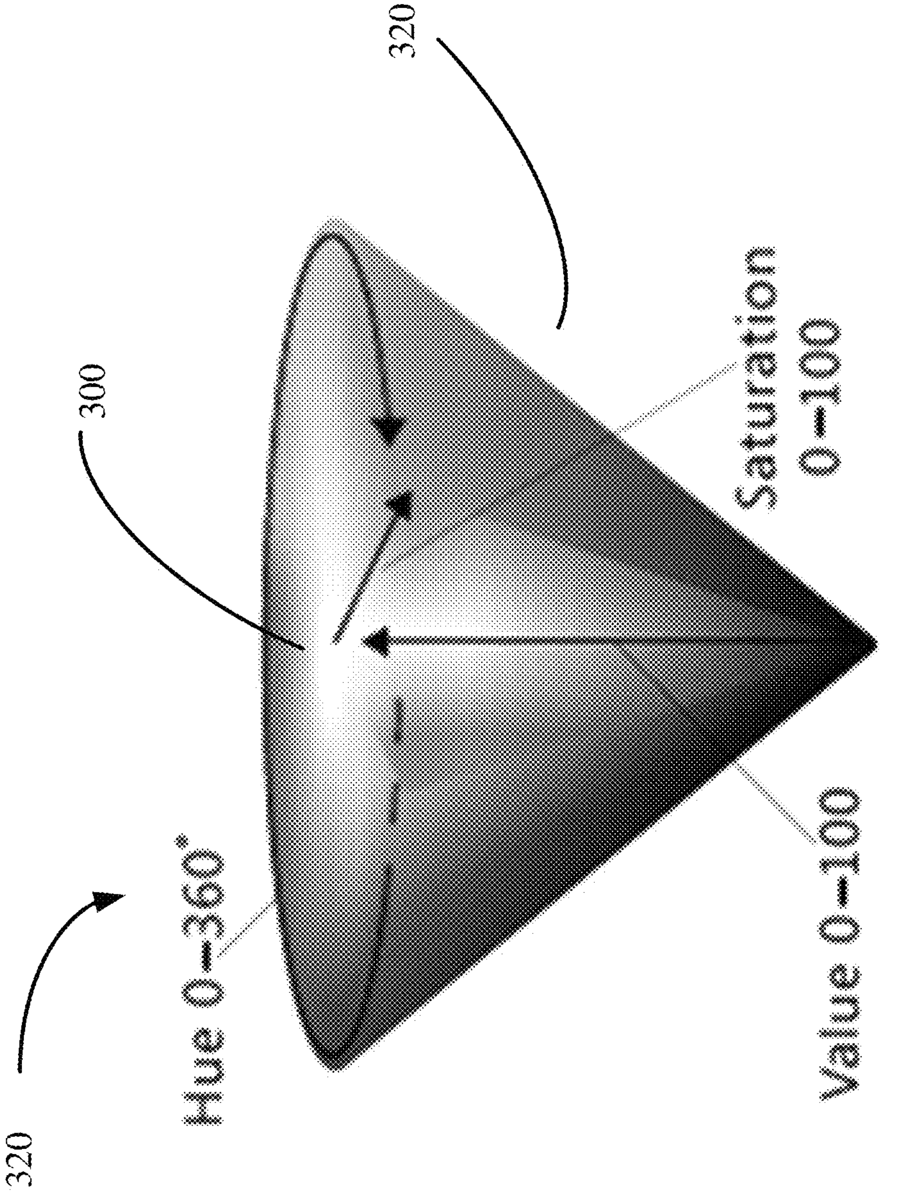
FIG. 3B schematically illustrates an embodiment of a color frustum of a cone according to an HSV palette.

FIG. 3A schematically illustrates an embodiment of a color wheel. FIG. 3B schematically illustrates a color frustum of a cone according to an HSV palette.

As schematically illustrated in FIG. 3A, in an HSV model, each color may be specified in a circular spectrum (or "color wheel") 310, in which the circle has a center and a 360-degree circular outer perimeter. Each hue is specified by a value from zero to 360, representing the color's position on a color wheel. To calculate the hue, the red, green, and blue components (e.g., from a corresponding basic palette) are used. Note that the diffuse color (from the basic palette) and the specular color (from the basic palette) may be expressed by values from zero degrees to 360 degrees, representing the color's position on a color wheel. In other words, each hue within the spectrum has a corresponding location around the circular perimeter, and may be identified by specifying its degree within the 360-degree circular outer perimeter.

Each hue also has a corresponding intensity. Whereas hue is represented by the angle from 0 to 360, hue brightness intensity is addressed by the saturation and the overall color intensity is addressed by the value illustrated in FIG. 3B.

In the illustrative embodiment of a color wheel 310 in FIG. 3B, the intensity of a hue may be characterized by its "saturation" value. In illustrative embodiments, a minimum saturation value of zero is illustrated at the center top of color frustum 300, and a saturation value of one indicates the maximum intensity of the hue, and is illustrated at the outer perimeter of the color wheel 310.

The HSV model also includes a frustum of a cone 320, as schematically illustrated in FIG. 3B, in which the frustum adds a dimension of "Saturation" and "Value" The value part indicates what the maximum of the R, G, and B values is and allows representation from black (Value=zero and Saturation=zero at the point of the frustum) to maximum brightness white (Value=100% (or 1) and Saturation=zero) at the top center of the frustum, on the color wheel 310.

Figure 2C:
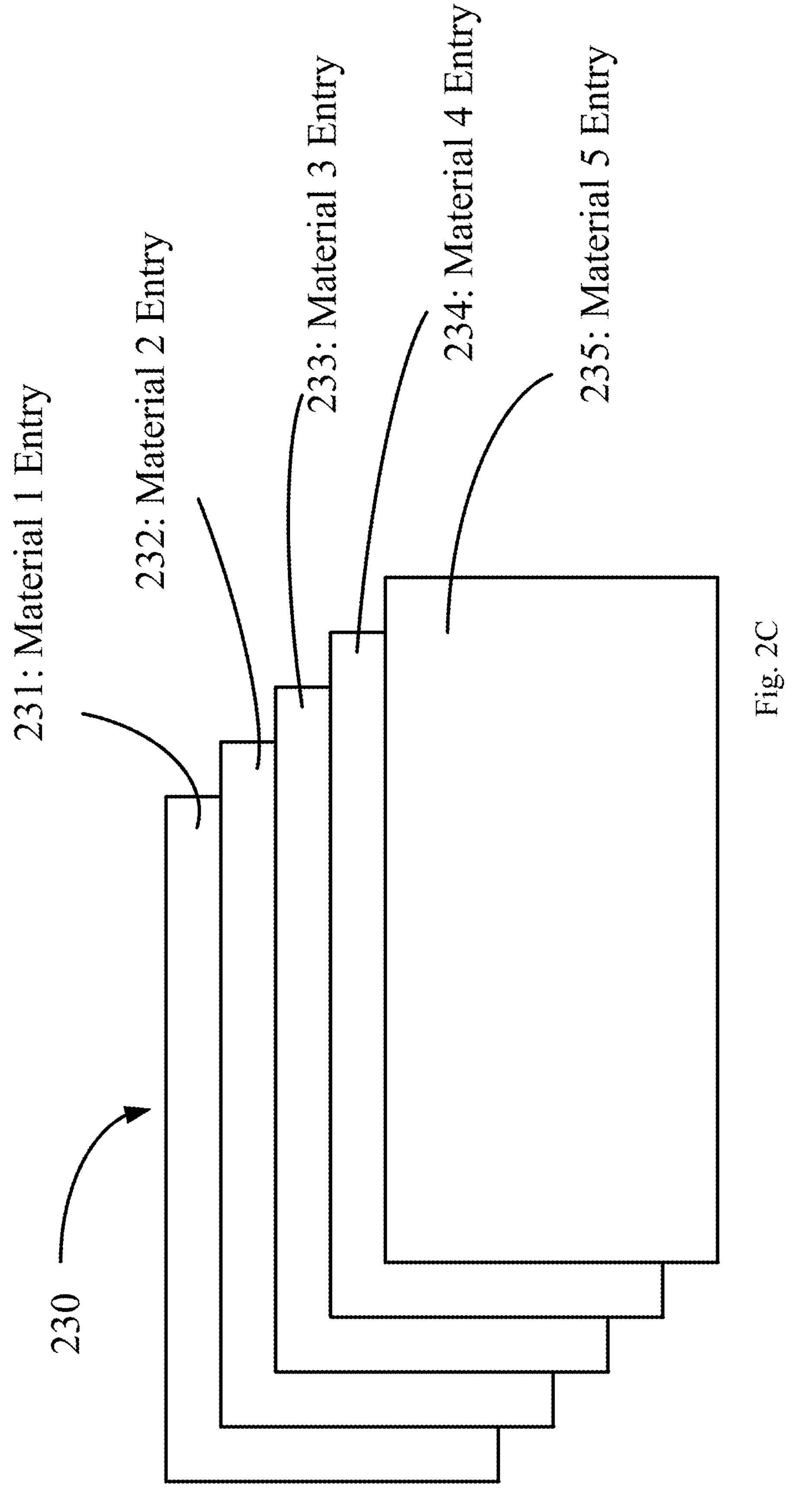
FIG. 2C schematically illustrates an embodiment of a PBR palette having a plurality of entries.

The PBR Palette (FIG. 2C)

FIG. 2C schematically illustrates an embodiment of a PBR palette 230 having a plurality of entries 231, 232, 233, 234 and 235.

A CAD system 100 that implements PBR rendering generates images from a palette (i.e., a "PBR palette") in which each entry includes a single color, and parameters for metalness (i.e., a "metalness" parameter) and roughness (i.e., a "roughness" parameter) of the material to be rendered.

For example, an entry of a PBR palette for a given material typically includes the following data:

| Color | Metalness | Roughness |
|---|---|---|
| Specify Color | Value of Metalness Parameter | Value of Roughness Parameter |

CAD systems that use PBR consume the single color, and the metalness parameter and the roughness parameter to render each object (or each material) in an image.

CAD users may sometimes desire to render an image using PBR, even though the palette available is not a PBR palette, but is instead a basic palette 210 (e.g., FIG. 2A). For example, the image to be rendered may have been designed or created using an older system that used conventional basic shading methods, and did not provide a PBR palette 230 or an ability to render and image from a PBR palette.

Figure 4:
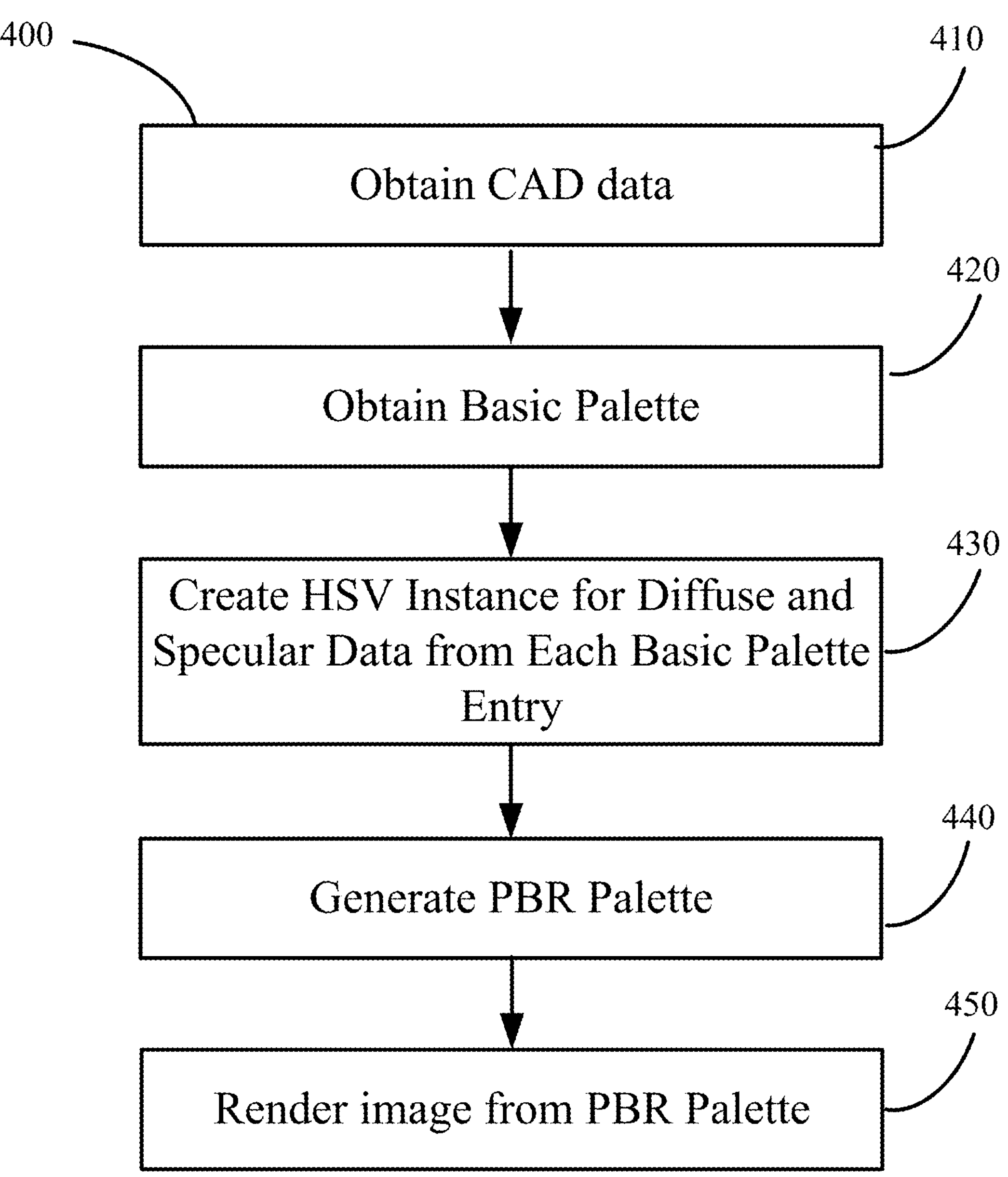
FIG. 4 is a flowchart of an embodiment of a method of rendering a CAD image.

FIG. 4 is a flowchart of an illustrative embodiment of a method 400.

Step 410 includes obtaining CAD data (e.g., a CAD model) of an image to be rendered. The image to be rendered is an image of a physical system, in which the physical system includes a set of objects, each object made of a corresponding physical material. For example, an industrial plant may have a floor made of concrete, pipes made of iron, and valves made of steel. The material corresponding to each object is specified as part of the CAD model. For example, the material corresponding to each object may be specified by a CAD system operator as part of creating the CAD model. In illustrative embodiments, the CAD data does not have or comprise a corresponding PBR palette.

The method also includes obtaining a basic model palette 210 corresponding to the image to be rendered, and an H-S palette (e.g., 220) corresponding to the image to be rendered. The basic model palette and the H-S palette may be generated from a basic model associated with a CAD model, according to methods known in the art . . . .

To that end, step 420 includes obtaining the basic model palette 210 corresponding to the image to be rendered. In illustrative embodiments, the basic model palette 210 has a plurality of entries, including an entry for each material in the image (e.g., each material of which an object is made).

Step 430 includes obtaining the H-S palette (e.g., 220). Illustrative embodiments include, or create from the basic palette 210, an entry (or page) in the H-S palette 220 for each entry (or page) in the corresponding basic palette 210. Illustrative embodiments transform the diffuse and specular colors for all basic palette materials (i.e., for each basic palette entry) from RGB to HSV color space. This is a well-known transformation that allows for the identification of color by its hue and saturation. The value part of an HSV palette indicates what the maximum of the R, G, and B values is and allows representation of black to maximum brightness white at the center of the illustrated cone.

Step 440 includes creating, from the basic palette 210 and the H-S palette 220, a physically based rendering ("PBR") palette 230 for the image to be rendered. The PBR palette 230 includes a plurality of PBR palette entries (231, 232, 233, 234, 235), each PBR entry corresponding to a one of the basic palette entries (211, 212, 213, 214, 215), of the basic palette 210 corresponding to the image to be rendered.

Step 450 includes rendering an image of the CAD model using the PBR palette.

Figure 5:
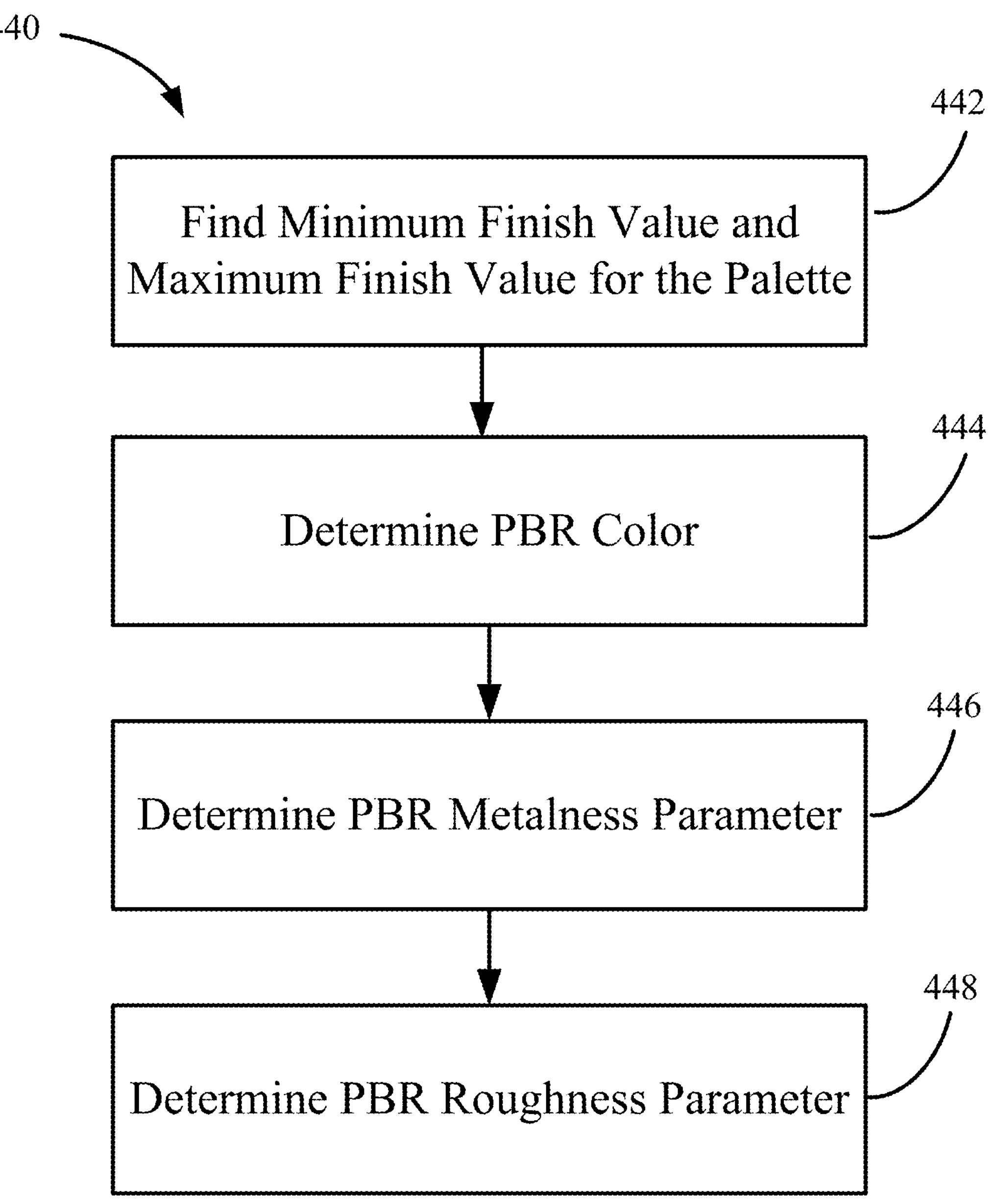
FIG. 5 is a flowchart of an embodiment of a method of specifying a roughness parameter a PBR palette entry.

FIG. 5 is a flow chart of an embodiment of a method for creating, from the basic palette 210 and the H-S palette 220, a physically based rendering ("PBR") palette 230 for the for the image to be rendered, at step 440.

In the embodiment of FIG. 5, Step 440 includes, at step 442, finding, from the entries of the basic palette, the maximum finish value of the basic palette, and the minimum finish value of the basic palette. It should be noted that the maximum finish value and the minimum finish value are the maximum and minimum finish values, respectively, from the entire basic palette 210, not the maximum and minimum finish values of each entry (211, 212, 213, 214, 215), of the palette 210. In other words, for the basic palette 210, there is a single maximum finish value and a single minimum finish value.

In the embodiment of FIG. 5, Step 440 includes, at step 444, determining the PBR color for each entry of the PBR palette. In illustrative embodiments, determining the PBR color for each entry of the PBR palette includes setting the color value of the PBR palette to the diffuse color of the basic palette entry.

In the embodiment of FIG. 5, Step 440 includes, at step 446, determining for each entry of the PBR palette the metalness of the PBR palette entry. FIG. 6 is a flowchart that illustrates an embodiment of a method of determining the metalness of the PBR palette entry.

Figure 7:
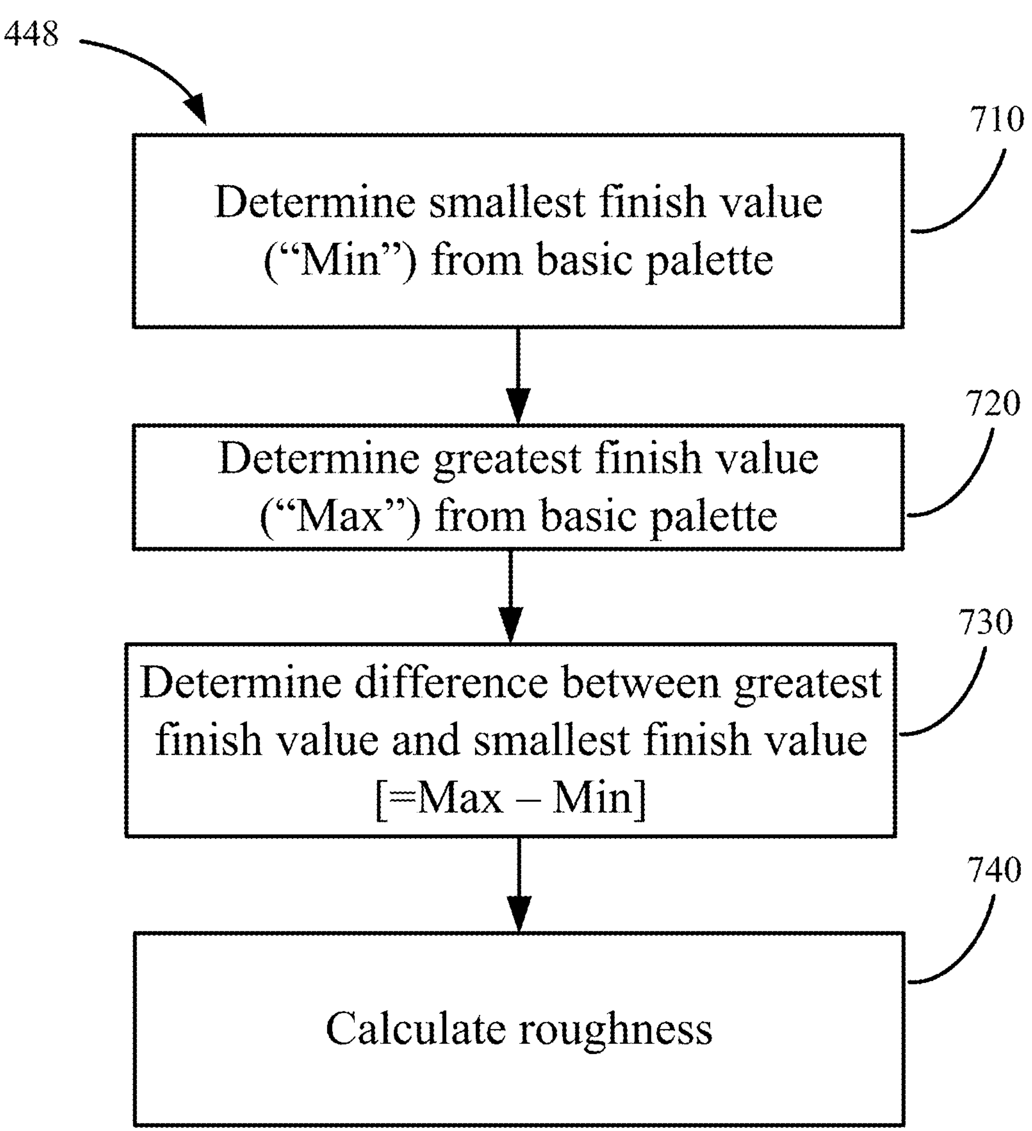
FIG. 7 is a flowchart of an embodiment of a method of specifying roughness parameter of a PBR palette entry.

In the embodiment of FIG. 5, Step 440 includes, at step 448, determining the roughness of the PBR palette entry. FIG. 7 is a flowchart that illustrates an embodiment of a method of determining the roughness of the PBR palette entry.

FIG. 6 is a flow chart that illustrates an embodiment of a method for determining the metalness of each PBR palette entry. The method of FIG. 6 is an embodiment of step 446, described above.

At step 610, the method determines, for each entry in the PBR palette, whether the specular hue of the corresponding H-S palette entry is near the diffuse hue of the corresponding H-S palette entry.

In illustrative embodiments, Step 610 includes determining whether any palette entry from the H-S palette has a specular hue near the diffuse hue of the same palette entry. As noted above, the specular hue and the diffuse hue in an H-S palette entry may each be specified with a corresponding angle (i.e., a diffuse angle, or degree, and a specular angle, or degree) of a color wheel 310. In illustrative embodiments, specular hue is quantitatively specified in degrees on a color wheel and diffuse hue is quantitatively specified in degrees on said color wheel. In such embodiments, specular hue is near the diffuse hue if the specular hue is within a pre-determined number of degrees (which pre-determined number of degrees may be referred-to as the Diffuse and Specular Nearness Parameter) of the diffuse hue on the color wheel, and is otherwise not near the diffuse hue.

Figure 3C:
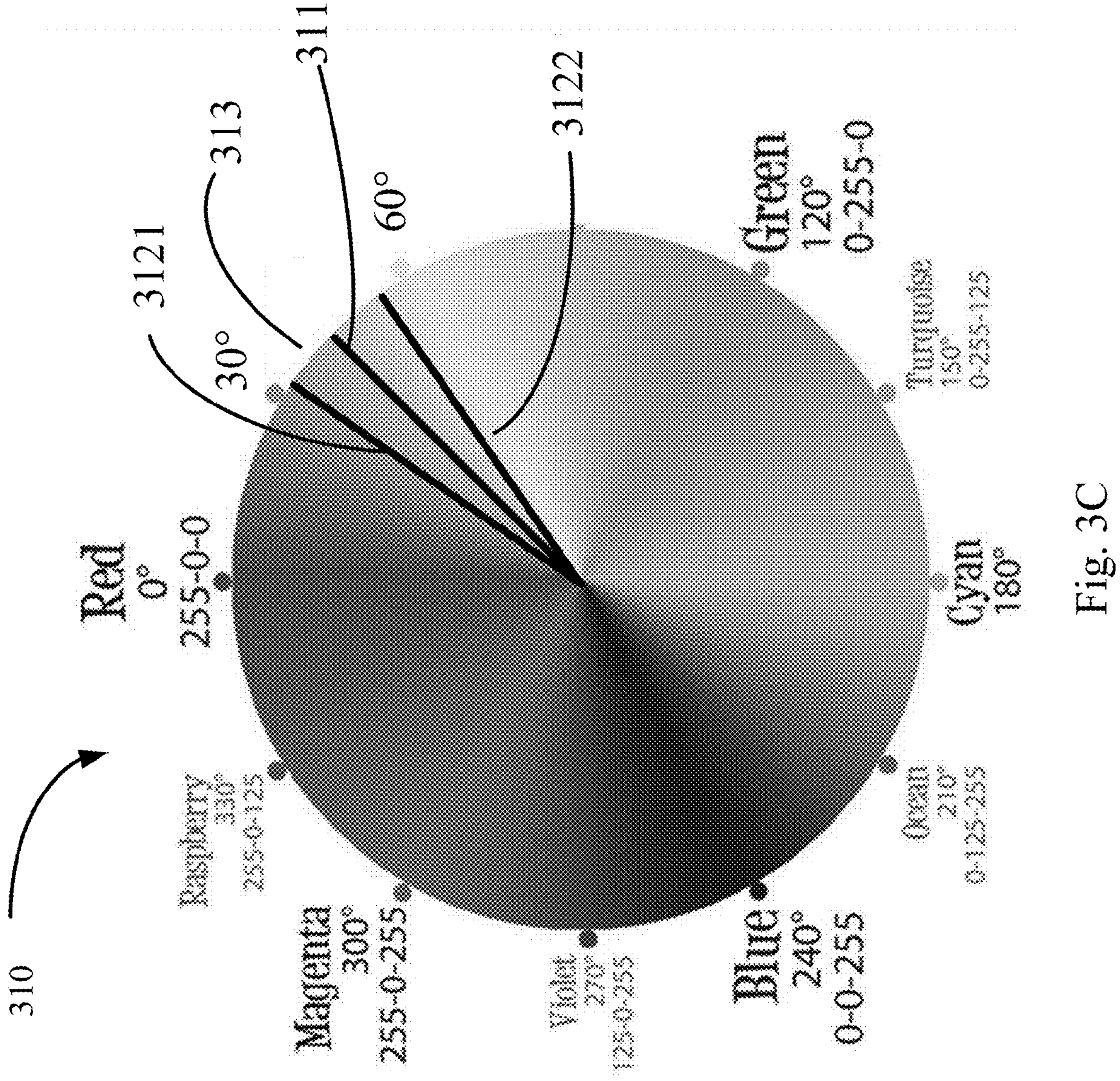
FIG. 3C schematically illustrates an embodiment of a color wheel.
Figure 3D:
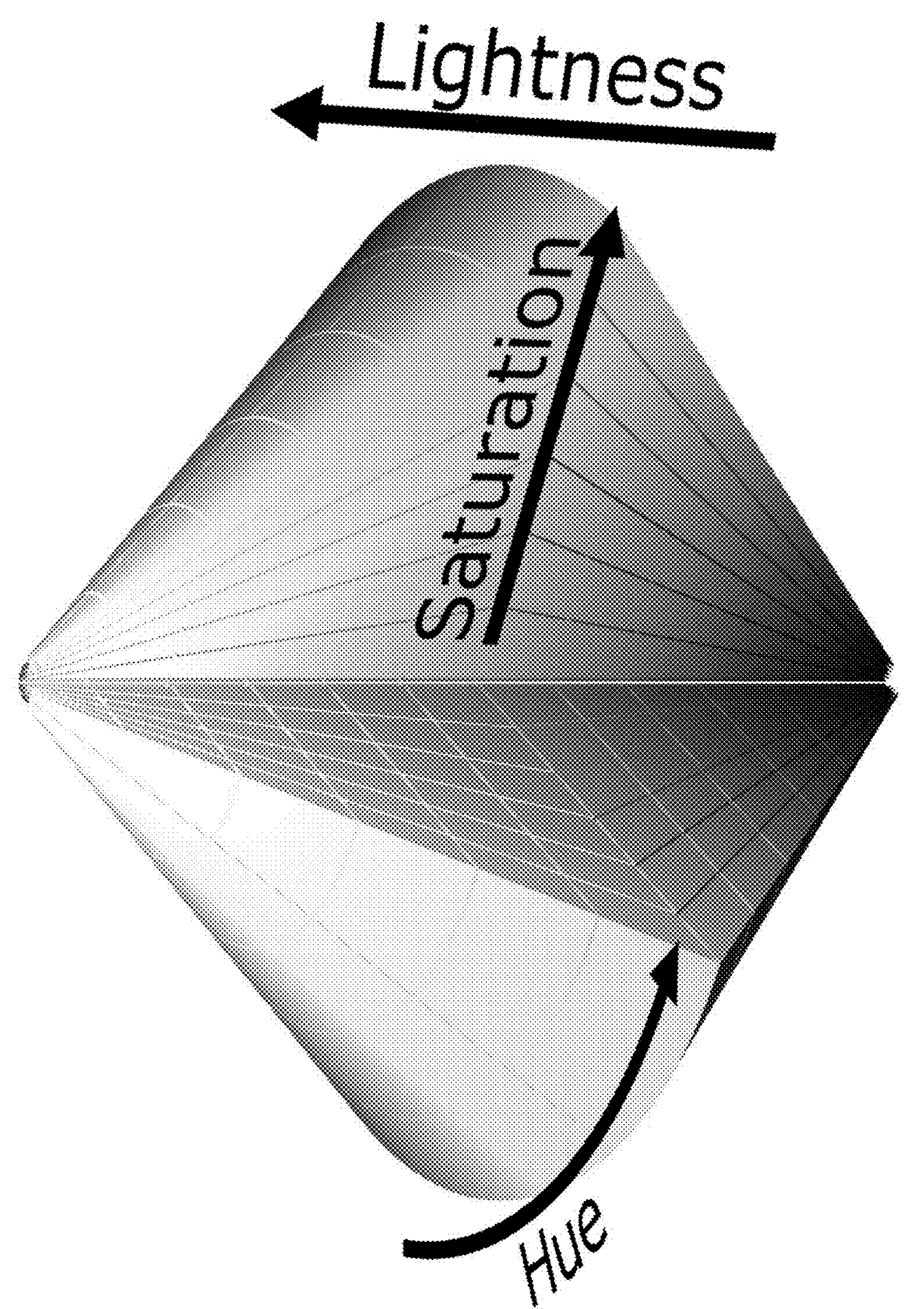
FIG. 3D schematically illustrates an embodiment of a HSL palette.

FIG. 3C schematically illustrates a color wheel 310 on which both a diffuse hue 311 and two specular hues 3121 and 3122 have been plotted, wherein the diffuse hue 311 and each specular hue 3121 and 3122 is represented by a corresponding line segment on the color wheel 310. The line segments of the diffuse hue 311 and the specular hue line segments 3121 and 3122 define, between them, an angle 313. Angle 313 may be described as the difference between the angle of specular hue 3121 and specular hue 3122. The angle 313 defines a range of hues which are considered near the diffuse hue 311, in which the diffuse hue 311 is equidistant between the two specular hue lines 3121 and 3122. So for a given diffuse angle at 313, a specular angle between 3121 and 3122 would indicate that the corresponding material is metallic.

In such embodiments, a specular hue may be deemed to be near the diffuse hue of the same palette entry in circumstance in which the difference 313 between the diffuse angle and a specular angle is at the less than a predetermined angular difference (e.g., number of degrees or radians). The predetermined angular difference may be referred-to as the diffuse and specular nearness parameter.

For example, in some embodiments, a specular hue may be deemed to be near the diffuse hue of the same palette entry if the difference between the diffuse angle and a specular angle is less than five (5) degrees (i.e., the pre-determined number of degrees is 5 degrees). In other embodiments, a specular hue may be deemed to be near the diffuse hue of the same palette entry if the difference between the diffuse angle and a specular angle is less than (i.e., the pre-determined number of degrees is) nine (9) degrees, or less than eight (8) degrees, or less than seven (7) degrees, or less than six (6) degrees, or less than four (4) degrees, or less than three (3) degrees, or less than two (2) degrees, or less than one (1) degree.

Step 630 sets the metalness parameter to a value of zero in cases in which the specular hue is not near the diffuse hue of the same palette entry. In cases in which the specular hue is near the diffuse hue of the same palette entry, the method instead proceeds to step 640.

Step 640 calculates the ratio of diffuse saturation to specular saturation. That ratio may be referred-to as the D/S ratio.

Step 650 compares the D/S ratio to a threshold, which may be referred-to as the Diffuse/Specular Threshold Parameter or the "D/S threshold." Quantitatively, the Diffuse/Specular Threshold Parameter allows for tuning of results when the Specular color has low saturation causing the metalness of the material to be uncertain or ambiguous. If the saturation of the specular entry is less than that of the diffuse and the ratio of Specular Saturation to Diffuse Saturation is less than a specified amount, then the overall metalness is reduced since the color of the materials shine isn't as deep (saturated) as expected for pure metallic materials. The D/S threshold may be 0.6. and may be set to 0.6 by default. However, a user may set the D/S threshold to another level, as desired. For example, a user may try one or more different D/S threshold levels to see which produces an image that most closely meets the user's needs. For example, the D/S ratio may be set to 0.45, 0.50, 0.55, 0.65, 0.70 or 0.75, as the user desires. To that end, the user may set the D/S threshold operate slider 821, as schematically illustrated in FIG. 8B, for example.

In each instance in which the D/S ratio is not less than the D/S threshold, step 670 sets the metalness parameter to one. Otherwise, in each instance in which the D/S ratio is less than the threshold, step 660 set the metalness parameter to the D/S ratio.

In illustrative embodiments, specular hue is quantitatively specified in degrees on a color wheel and diffuse hue is quantitatively specified in degrees on said color wheel, and specular hue is near the diffuse hue if the specular hue is within a pre-determined number of degrees on the color wheel of the diffuse hue, and is otherwise not near the diffuse hue.

In some embodiments, the process of setting a metalness parameter by assessing the specular hue and the diffuse hue from the corresponding H-S palette includes: (1) for each entry in which the specular hue is not near the diffuse hue, setting the metalness parameter to a value of zero; and (2) for each entry in which the specular hue is near the diffuse hue, and for which a ratio of diffuse saturation to specular saturation is not less than a predetermined diffuse/saturation threshold, setting the metalness parameter to a value of one; and (3) for each entry in which the specular hue is near the diffuse hue, and for which a ratio of diffuse saturation to specular saturation is less than the predetermined diffuse/saturation threshold, setting the metalness parameter to a value of the ratio of diffuse saturation to specular saturation.

An alternate method of determining the metalness of each PBR palette entry includes categorizing the PBR entry into one of a set of categories, and setting the metalness to a metalness value corresponding to the category. The categories are selected from (a) a category for situations in which the specular hue is not near the diffuse hue (according to step 610), and the corresponding metalness value is zero; (b) a category for situations in which the specular hue is near the diffuse hue (according to step 610), and the ratio of diffuse saturation to specular saturation is less than a threshold (according to step 650), and the corresponding metalness value is the ratio divided by the threshold, and (c) a category for situations in which the specular hue is not near the diffuse hue (according to step 610) and the ratio of diffuse saturation to specular saturation is not less than the threshold (according to step 650), and the corresponding metalness value is one.

FIG. 7 is a flow chart that illustrates an embodiment of a method for determining the roughness of each PBR palette entry of a palette having a plurality of entries, each palette entry having a corresponding finish. The method of FIG. 7 is an embodiment of step 448, described above.

Step 710 includes determining the smallest finish value (which may be referred-to as "Min") of the basic palette, as described herein.

Step 720 includes determining the greatest finish value (which may be referred-to as "Max") of the basic palette, as described herein.

Step 730 includes determining the difference between the greatest finish value and the smallest finish value (i.e., Max-Min).

Step 740 includes setting the roughness parameter for each palette entry according to the formula:

$$\text{Roughness} = (1 - \text{entry\_finish} - \text{minimum finish value}) / (\text{maximum finish value} - \text{minimum finish value}) \text{ or,}$$

$$\text{stated alternatively: Roughness} = 1 - (\text{entry\_Finish} - \text{Min}) / (\text{Max} - \text{Min}),$$

or $$\text{Roughness} = (1 - \text{smallest finish value}) / (\text{greatest finish value} - \text{smallest finish value}).$$

Figure 8A:
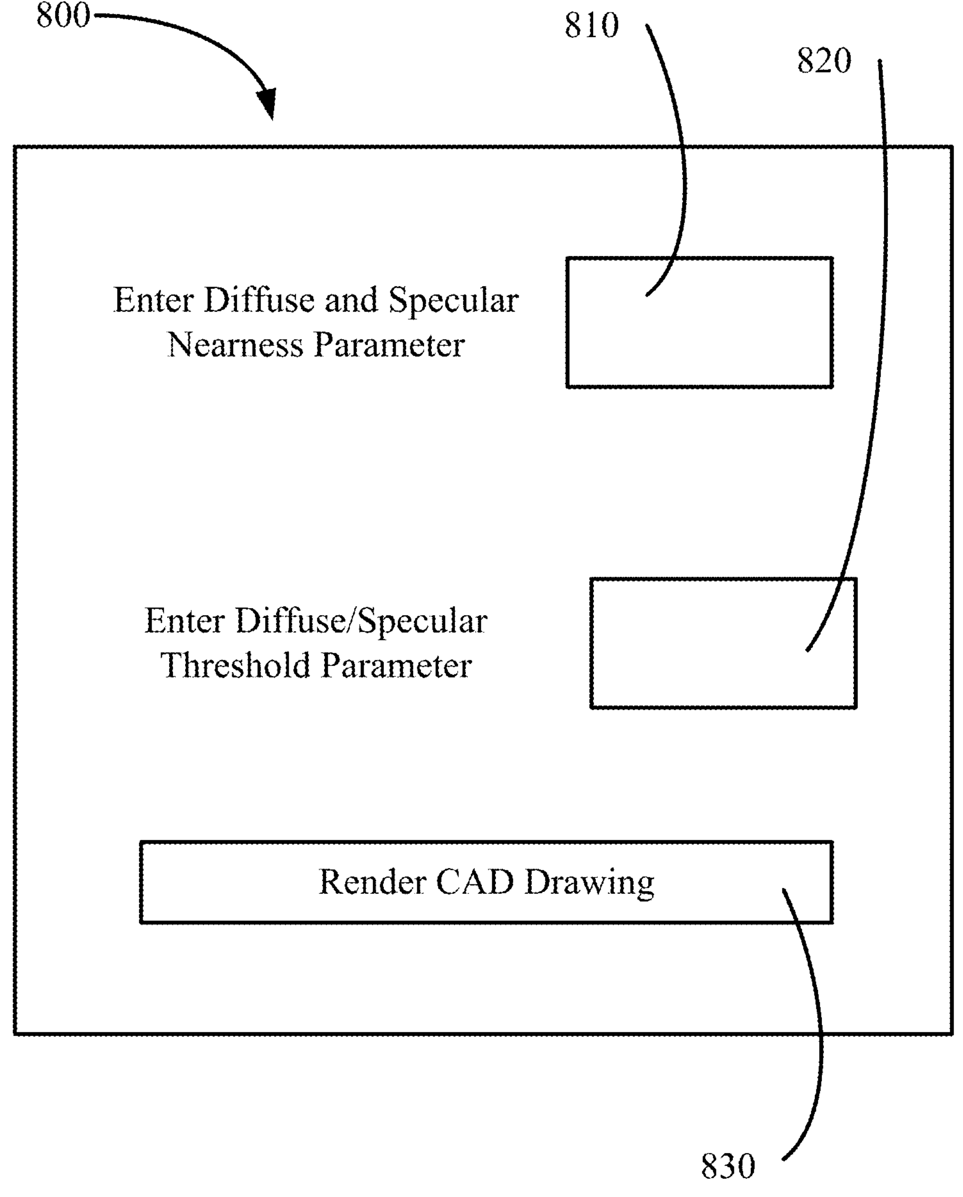
FIG. 8A schematically illustrates an embodiment of a graphical user interface.
Figure 8B:
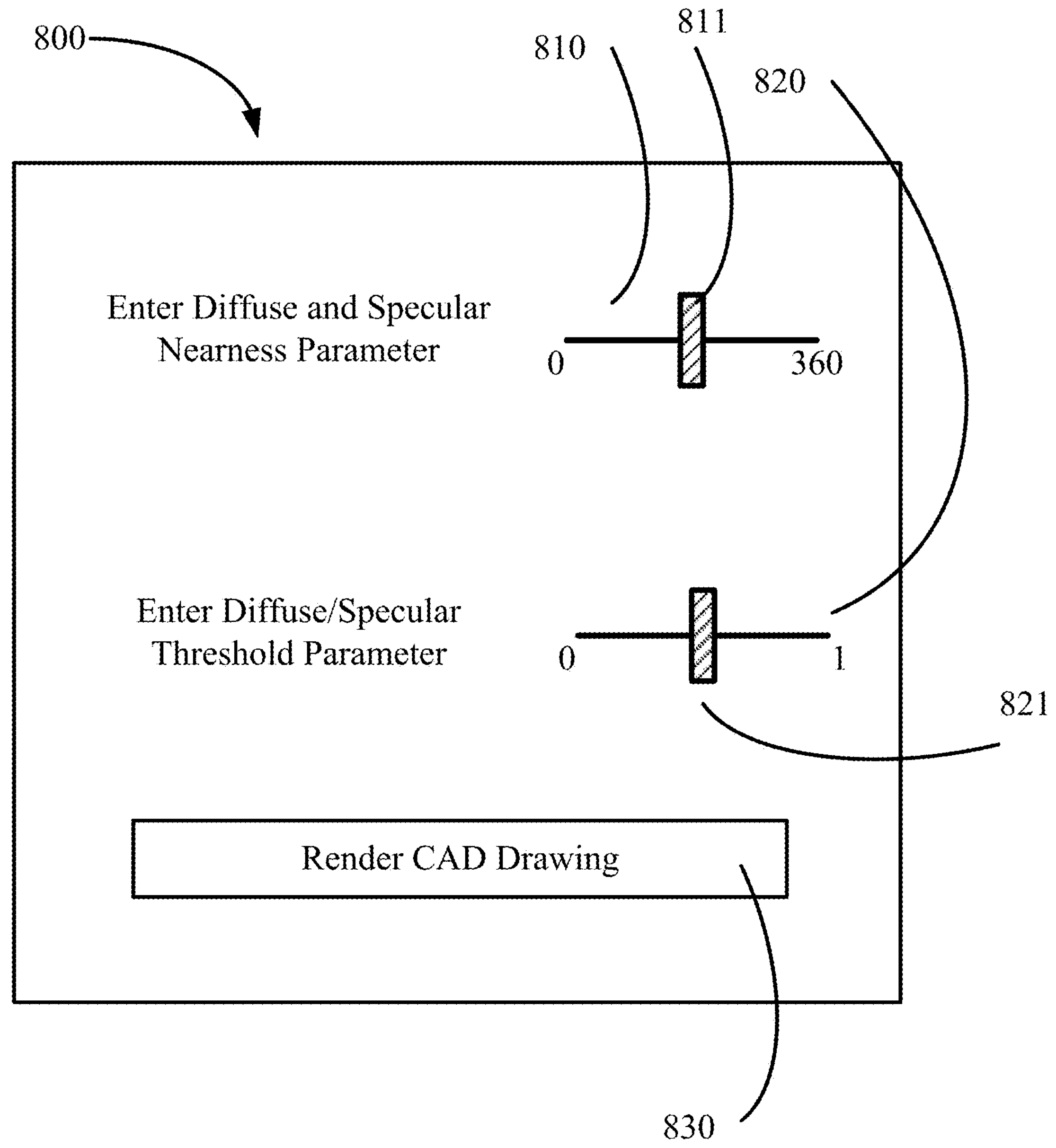
FIG. 8B schematically illustrates an embodiment of a graphical user interface.

FIG. 8A schematically illustrates an embodiment of a user interface 800 configured to solicit and receive from a system operator specification of the Diffuse and Specular Nearness Parameter, as described above, and to solicit and receive from the system operator specification of the Diffuse/Specular Threshold Parameter, as described above.

In the embodiment of FIG. 8A, the user interface 800 includes an input device 810 to receive from the system operator specification of the Diffuse and Specular Nearness Parameter. In illustrative embodiments, the input device 810 includes a text box into which the system operator may type-in (i.e., specify) the value of Diffuse and Specular Nearness Parameter. As described above, the value of Diffuse and Specular Nearness Parameter may be specified in degrees of the color wheel 310. In some embodiments, the Diffuse and Specular Nearness Parameter may be specified in degrees, radians, or other measure of the angles of the color wheel 310. In some embodiments, the Diffuse and Specular Nearness Parameter may be set to a default value of five degrees, subject to change by the system operator using the user interface 800. In some embodiments, the system operator may set the Diffuse and Specular Nearness Parameter to, for example, 1 degree, 2 degrees, 3 degrees, 4 degrees, 5 degrees, 6 degrees, 7 degrees, 8 degrees, or other value between zero degrees and 360 degrees.

In the embodiment of FIG. 8A, the user interface 800 includes an input device 820 to receive from the system operator specification of the Diffuse/Specular Threshold Parameter. In some embodiments, the Diffuse/Specular Threshold Parameter may be set to a default value of 0.6 (or 60%), subject to change by the system operator using the user interface 800. In some embodiments, the system operator may set the Diffuse/Specular Threshold Parameter to, for example, 0.1 (or 10%), 0.2 (or 30%), 0.3 (or 30%), 0.4 (or 40%), 0.5 (or 50%), 0.6 (or 60%), 0.7 (or 70%), 0.8 (or 80%), 0.9 (or 90%), or 0.99 (or 99%), or other value between zero and one.

FIG. 8B schematically illustrates an alternative embodiment of a user interface 800. In FIG. 8B, the input device 810 to receive from the system operator specification of the Diffuse and Specular Nearness Parameter includes a slider 811. In some embodiments, the system operator may use the slider 811 to set the Diffuse and Specular Nearness Parameter to, for example, 1 degree, 2 degrees, 3 degrees, 9 degrees, 5 degrees, 6 degrees, 7 degrees, 8 degrees, or other value between zero degrees and 360 degrees.

In FIG. 8B, the input device to 820 to receive from the system operator specification of the Diffuse/Specular Threshold Parameter includes a slider 821. In some embodiments, the system operator may use the slider 821 to set the Diffuse/Specular Threshold Parameter to, for example, 0.1 (or 10%), 0.2 (or 30%), 0.3 (or 30%), 0.4 (or 40%), 0.5 (or 50%), 0.6 (or 60%), 0.7 (or 70%), 0.8 (or 80%), 0.9 (or 90%), or 0.99 (or 99%), or other value between zero and one.

In some embodiments, a method includes receiving, via the user interface 800, specification by a system operator of at least one of (1) a diffuse and specular nearness parameter, and (2) a diffuse/specular threshold parameter.

In illustrative embodiments, the user interface 800 also includes a button 830 to receive from the system operator an instruction to render the CAD drawing using the Diffuse and Specular Nearness Parameter and/or the Diffuse/Specular Threshold Parameter specified using the input device 810 and/or the input device 820 of the user interface 800. The power of modern computers allows the CAD system 100 to quickly render a CAD drawing according to embodiments disclosed herein for operator-specified Diffuse and Specular Nearness Parameter and/or the Diffuse/Specular Threshold Parameter so that the system operator can quickly and easily try different values of Diffuse and Specular Nearness Parameter, and/or Diffuse/Specular Threshold Parameter, or combinations thereof, to assess which Diffuse and Specular Nearness Parameter, and/or Diffuse/Specular Threshold Parameter or combinations thereof produce a rendered CAD drawing that satisfies the system operator's needs.

Some embodiments automatically render an image based on the CAD model and the PBR palette in response to receiving, from a system operator, at least one of (1) a diffuse and specular nearness parameter, and (2) a diffuse/specular threshold parameter, without receiving from the system operator an instruction to render the CAD drawing A listing of certain reference numbers is presented below.

100: CAD system;

102: CAD system processing unit;

104: Computer display having a display screen;

106: Computer keyboard 106;

108: Computer mouse 108;

120: Communications interface;

121: Data bus;

130: Computer memory;
140: Transform module;
150: Color determination module;
160: Metalness module;
170: Roughness module;
180: Image generation module;
210: Basic palette;
220: H-S palette;
230: PBR palette;
310: Color wheel;
311: Diffuse hue line segment;
312: Specular hue line segment;
313: Angle between diffuse hue line segment and specular hue line segment;
320: HSV color cone.

Various embodiments may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

Without limitation, potential subject matter that may be claimed (prefaced with the letter "P" so as to avoid confusion with the actual claims presented below) includes:

P1. A computer-implemented method executed by a computer, the method comprising:
obtaining a model for a computer-aided-design environment, the model comprising a plurality of materials;
obtaining a basic palette corresponding to the model, the basic palette comprising a plurality of basic palette entries;
obtaining an H-S palette corresponding to the model, the H-S palette comprising a plurality of H-S entries, each H-S entry corresponding to a one of the basic palette entries, and comprising a corresponding hue parameter and a corresponding saturation parameter;
finding, from the plurality of basic palette entries, the minimum finish value and the maximum finish value;
creating, from the basic palette and the H-S palette, a physically based rendering ("PBR") palette for the model, the PBR palette comprising a plurality of PBR palette entries, each PBR entry corresponding to a one of the basic palette entries of the basic palette, by, for each PBR palette entry:
setting the color value of the PBR palette to a color selected from the specular color of the corresponding basic palette entry and the diffuse color of the basic palette entry;
setting a metalness parameter by assessing the specular hue and the diffuse hue from the corresponding H-S palette;
setting a roughness parameter based on the smallest finish value of the basic palette and the greatest finish value of the basic palette; and
rendering the image from the PBR palette.

P2: The computer-implemented method of P1, further comprising:
receiving, via a user interface, specification by a system operator of at least one of (1) a diffuse and specular nearness parameter, and (2) a diffuse/specular threshold parameter.

P11: A method comprising:
obtaining a model for a computer-aided-design environment, the model comprising a plurality of materials and not comprising a PBR palette;
obtaining a basic palette corresponding to the model, the basic palette comprising a plurality of basic palette entries;
obtaining an H-S palette corresponding to the model, the H-S palette comprising a plurality of H-S entries, each H-S entry corresponding to a one of the basic palette entries, and comprising a corresponding hue parameter and a corresponding saturation parameter;
finding, from the plurality of basic palette entries, the minimum finish value and the maximum finish value;
creating, from the basic palette and the H-S palette, a physically based rendering ("PBR") palette for the model, the PBR palette comprising a plurality of PBR palette entries, each PBRS entry corresponding to a one of the basic palette entries of the basic palette, by, for each PBR palette entry:
setting the color value of the PBR palette to a color selected from the specular color of the corresponding basic palette entry and the diffuse color of the basic palette entry;
setting a metalness parameter by assessing the specular hue and the diffuse hue from the corresponding H-S palette;
setting a roughness parameter based on the smallest finish value of the basic palette and the greatest finish value of the basic palette; and
rendering an image from the PBR palette.

P12. The method of P11, wherein the H-S palette comprises a palette in the Hue, Saturation, Value format.

P13. The method of any of P11-P12, wherein the H-S palette comprises a palette in the Hue, Saturation, Lightness format.

P14. The method of any of P11-P13, wherein obtaining an H-S palette corresponding to the model comprises converting the basic palette to the H-S palette.

P15. The method of any of P11-P14, wherein specular hue is quantitatively specified in degrees on a color wheel and diffuse hue is quantitatively specified in degrees on said color wheel, wherein setting a metalness parameter by assessing the specular hue and the diffuse hue from the corresponding H-S palette comprises:
for each entry in which the specular hue is not near the diffuse hue, setting the metalness parameter to a value of zero; and
for each entry in which the specular hue is near the diffuse hue, and for which a ratio of diffuse saturation to specular saturation is not less than a predetermined diffuse/saturation threshold, setting the metalness parameter to a value of one; and
for each entry in which the specular hue is near the diffuse hue, and for which a ratio of diffuse saturation to specular saturation is less than the predetermined diffuse/saturation threshold, setting the metalness parameter to a value of the ratio of diffuse saturation to specular saturation, wherein specular hue is near the diffuse hue if the specular hue is within a pre-determined number of degrees of the diffuse hue on the color wheel, and is otherwise not near the diffuse hue.

P16. The method of any of P11-P15, wherein setting a metalness parameter by assessing the specular hue and the diffuse hue from the corresponding H-S palette comprises:

categorizing the PBR entry into one of a set of categories, and setting the metalness to a metalness value corresponding to the category, wherein the categories are selected from:

(a) a category for situations in which the specular hue is not near the diffuse hue, and the corresponding metalness value is zero;

(b) a category for situations in which the specular hue is near the diffuse hue and the ratio of diffuse saturation to specular saturation is less than a threshold, and the corresponding metalness value is the ratio divided by the threshold; and (c) a category for situations in which the specular hue is not near the diffuse hue and the ratio of diffuse saturation to specular saturation is not less than the threshold, and the corresponding metalness value is one.

P17. The method of any of P11-P16, wherein setting the roughness parameter comprises:

determining, from among the finish values of the basic palette, the smallest finish value of the basic palette;

subtracting said smallest finish value of the basic palette from 1;

determining, from among the finish values of the basic palette, the greatest finish value of the basic palette;

determining the difference between greatest finish value of the basic palette from the smallest finish value of the basic palette;

setting the roughness parameter to according to the formula:

$$\text{roughness}=(1-\text{smallest finish value})/(\text{greatest finish value}-\text{smallest finish value}).$$

P18. The method of any of P11-P17, wherein the pre-determined number of degrees comprises a Diffuse and Specular Nearness Parameter, and the method includes receiving specification of the Diffuse and Specular Nearness Parameter from a user interface.

P19. The method of any of P11-P18, wherein assessing the specular hue and the diffuse hue from the corresponding H-S palette comprises:

determining a ratio of the diffuse hue to the specular hue, receiving specification of the Diffuse/Specular Threshold Parameter from a user interface; and comparing said ratio of the diffuse hue to the specular hue to the Diffuse/Specular Threshold Parameter.

P31. A system comprising:

a memory to store:

a CAD model to be rendered, the CAD model having a plurality of materials; and a basic palette corresponding to the CAD model, the basic palette having a plurality of basic palette entries, each basic palette entry of the plurality of basic palette entries corresponding to a corresponding material from the plurality of materials; and an H-S palette corresponding to the CAD model, the H-S palette having a plurality of H-S palette entries, each H-S palette entry of the plurality of H-S palette entries corresponding to a corresponding material from the plurality of materials;

a set of modules configured to generate a set of PBR palette entries in a PBR palette corresponding to the CAD model, each PBR palette entry of the plurality of PBR palette entries corresponding to a corresponding material from the plurality of materials, the set of modules comprising:

a color determination module configured to determine, for each PBR palette entry, a color parameter;

a metalness module configured to determine, for each PBR palette entry, a metalness parameter;

a roughness module configured to determine, for each PBR palette entry, a roughness parameter; and an image generation module configured to generate an image of the CAD model from the PBR palette.

P32. The system of P31, further comprising a transformation module configured to generate the H-S palette from the basic palette.

P33. The system of any of P31-P32, wherein the color determination module is configured to determine, for each PBR palette entry, a color parameter by:

setting the color value of the PBR palette to a color selected from the specular color of the corresponding basic palette entry and the diffuse color of the basic palette entry.

P34. The system of any of P31-P33, wherein specular hue is quantitatively specified in degrees on a color wheel and diffuse hue is quantitatively specified in degrees on said color wheel, and wherein the metalness module is configured to determine, for each PBR palette entry, a metalness parameter by:

for each entry in which the specular hue is not near the diffuse hue, setting the metalness parameter to a value of zero; and for each entry in which the specular hue is near the diffuse hue, and for which a ratio of diffuse saturation to specular saturation is not less than a predetermined diffuse/saturation threshold, setting the metalness parameter to a value of one; and for each entry in which the specular hue is near the diffuse hue, and for which a ratio of diffuse saturation to specular saturation is less than the predetermined diffuse/saturation threshold, setting the metalness parameter to a value of the ratio of diffuse saturation to specular saturation, wherein specular hue is near the diffuse hue if the specular hue is within a pre-determined number of degrees of the diffuse hue on the color wheel, and is otherwise not near the diffuse hue.

P35. The system of any of P31-P34, wherein the metalness module is configured to determine, for each PBR palette entry, a metalness parameter by:

categorizing the PBR entry into one of a set of categories, and setting the metalness parameter to a metalness value corresponding to the category, wherein the categories are selected from:

(a) a category for situations in which the specular hue is not near the diffuse hue, and the corresponding metalness value is zero;

(b) a category for situations in which the specular hue is near the diffuse hue and the ratio of diffuse saturation to specular saturation is less than a threshold, and the corresponding metalness value is the ratio divided by the threshold; and (c) a category for situations in which the specular hue is not near the diffuse hue and the ratio of diffuse saturation to specular saturation is not less than the threshold, and the corresponding metalness value is one.

P36. The system of any of P31-P35, wherein the metalness module is configured to determine, for each PBR palette entry, a metalness parameter by:

receiving specification of a Diffuse/Specular Threshold Parameter from a user interface; and comparing a ratio of diffuse hue to specular hue to the Diffuse/Specular Threshold Parameter.

P41. A non-transitory computer readable medium having computer-executable code therein, in which the computer executable code, when executed by a computer, causes the computer to perform a method comprising:

obtaining a model for a computer-aided-design environment, the model comprising a plurality of materials;

obtaining a basic palette corresponding to the model, the basic palette comprising a plurality of basic palette entries, each basic palette entry of the plurality of basic palette entries corresponding to a material from the plurality of materials and having a corresponding finish value;

obtaining an H-S palette corresponding to the model, the H-S palette comprising a plurality of H-S entries, each H-S entry corresponding to a one of the basic palette entries, and comprising a corresponding hue parameter and a corresponding saturation parameter;

finding, from the plurality of basic palette entries, the minimum finish value and the maximum finish value;

creating, from the basic palette and the H-S palette, a physically based rendering ("PBR") palette for the model, the PBR palette comprising a plurality of PBR palette entries, each PBR entry corresponding to a one of the basic palette entries of the basic palette, by, for each PBR palette entry:

setting the color value of the PBR palette to a color selected from the specular color of the corresponding basic palette entry and the diffuse color of the basic palette entry;

setting a metalness parameter by assessing the specular hue and the diffuse hue from the corresponding H-S palette;

setting a roughness parameter based on the smallest finish value of the basic palette and the greatest finish value of the basic palette; and rendering the image from the PBR palette.

P42. The non-transitory computer readable medium of P41, wherein the H-S palette comprises a palette in the Hue, Saturation, Value format.

P43. The non-transitory computer readable medium of any of P41-P42, wherein specular hue is quantitatively specified in degrees on a color wheel and diffuse hue is quantitatively specified in degrees on said color wheel, and wherein specular hue is near the diffuse hue if the specular hue is within a pre-determined number of degrees of the diffuse hue on the color wheel, and is otherwise not near the diffuse hue, and wherein setting a metalness parameter by assessing the specular hue and the diffuse hue from the corresponding H-S palette comprises:

for each entry in which the specular hue is not near the diffuse hue, setting the metalness parameter to a value of zero; and for each entry in which the specular hue is near the diffuse hue, and for which a ratio of diffuse saturation to specular saturation is not less than a predetermined diffuse/saturation threshold, setting the metalness parameter to a value of one; and for each entry in which the specular hue is near the diffuse hue, and for which a ratio of diffuse saturation to specular saturation is less than the predetermined diffuse/saturation threshold, setting the metalness parameter to a value of the ratio of diffuse saturation to specular saturation.

P44. The non-transitory computer readable medium of any of P41-P43, wherein obtaining an H-S palette corresponding to the model comprises converting the basic palette to the H-S palette.

P45. The non-transitory computer readable medium of P41-P45, wherein setting a metalness parameter by assessing the specular hue and the diffuse hue from the corresponding H-S palette comprises:

categorizing the PBR entry into one of a set of categories, and setting the metalness to a metalness value corresponding to the category, wherein the categories are selected from:

(a) a category for situations in which the specular hue is not near the diffuse hue, and the corresponding metalness value is zero;

(b) a category for situations in which the specular hue is near the diffuse hue and the ratio of diffuse saturation to specular saturation is less than a threshold, and the corresponding metalness value is the ratio divided by the threshold; and (c) a category for situations in which the specular hue is not near the diffuse hue and the ratio of diffuse saturation to specular saturation is not less than the threshold, and the corresponding metalness value is one.

P46. The non-transitory computer readable medium of any of P41-P45, wherein assessing the specular hue and the diffuse hue from the corresponding H-S palette comprises:

receiving specification of a Diffuse/Specular Threshold Parameter from a user interface; and comparing a ratio of the diffuse hue to the specular hue to the Diffuse/Specular Threshold Parameter.

Various embodiments of this disclosure may be implemented at least in part in any conventional computer programming language. For example, some embodiments may be implemented in a procedural programming language (e.g., "C"), or in an object-oriented programming language (e.g., "C++"), or in Python, R, Java, LISP, or Prolog. Other embodiments of this disclosure may be implemented as preprogrammed hardware elements (e.g., application specific integrated circuits, FPGAs, and digital signal processors), or other related components.

In an alternative embodiment, the disclosed apparatus and methods may be implemented as a computer program product for use with a computer system. Such implementation may include a series of computer instructions fixed either on a tangible medium, such as a non-transitory computer readable medium (e.g., a diskette, CD-ROM, ROM, FLASH memory, or fixed disk). The series of computer instructions can embody all or part of the functionality previously described herein with respect to the system.

Those skilled in the art should appreciate that such computer instructions can be written in a number of programming languages for use with many computer architectures or operating systems. Furthermore, such instructions may be stored in any memory device, such as semiconductor, magnetic, optical or other memory devices, and may be transmitted using any communications technology, such as optical, infrared, microwave, or other transmission technologies.

Among other ways, such a computer program product may be distributed as a removable medium with accompanying printed or electronic documentation (e.g., shrink wrapped software), preloaded with a computer system (e.g., on system ROM or fixed disk), or distributed from a server or electronic bulletin board over the network (e.g., the Internet or World Wide Web). Of course, some embodiments of this disclosure may be implemented as a combination of both software (e.g., a computer program product) and hardware. Still other embodiments of this disclosure are implemented as entirely hardware, or entirely software.

Computer program logic implementing all or part of the functionality previously described herein may be executed at different times on a single processor (e.g., concurrently) or may be executed at the same or different times on multiple processors and may run under a single operating system process/thread or under different operating system processes/threads. Thus, the term "computer process" refers generally to the execution of a set of computer program instructions regardless of whether different computer processes are executed on the same or different processors and regardless of whether different computer processes run under the same operating system process/thread or different operating system processes/threads.

The embodiments described above are intended to be merely exemplary; numerous variations and modifications will be apparent to those skilled in the art. All such variations and modifications are intended to be within the scope of the present disclosure as defined in any appended claims.

What is claimed is:

1. A computer-implemented method comprising:

obtaining a model for a computer-aided-design environment, the model comprising a plurality of materials and not comprising a PBR palette;

obtaining a basic palette corresponding to the model, the basic palette comprising a plurality of basic palette entries;

obtaining an H-S palette corresponding to the model, the H-S palette comprising a plurality of H-S entries, each H-S entry corresponding to a one of the basic palette entries, and comprising a corresponding hue parameter and a corresponding saturation parameter;

finding from the plurality of basic palette entries, the minimum finish value and the maximum finish value;

creating from the basic palette and the H-S palette, a physically based rendering ("PBR") palette for the model, the PBR palette comprising a plurality of PBR palette entries, each PBR entry corresponding to a one of the basic palette entries of the basic palette, by, for each PBR palette entry:

setting the color value of the PBR palette to a color selected from the specular color of the corresponding basic palette entry and the diffuse color of the corresponding basic palette entry;

setting a metalness parameter by assessing the specular hue and the diffuse hue from the corresponding H-S palette, wherein specular hue is quantitatively specified on a color wheel and diffuse hue is quantitatively specified on said color wheel, and wherein setting a metalness parameter by assessing the specular hue and the diffuse hue from the corresponding H-S palette comprises:

for each entry in which the specular hue is not near the diffuse hue, setting the metalness parameter to a value of zero; and for each entry in which the specular hue is near the diffuse hue, and for which a ratio of diffuse saturation to specular saturation is not less than a predetermined diffuse/saturation threshold, setting the metalness parameter to a value of one; and for each entry in which the specular hue is near the diffuse hue, and for which a ratio of diffuse saturation to specular saturation is less than the predetermined diffuse/saturation threshold, setting the metalness parameter to a value of the ratio of diffuse saturation to specular saturation, wherein the specular hue is near the diffuse hue if the specular hue is within a pre-determined number of degrees of the diffuse hue on the color wheel, and is otherwise not near the diffuse hue;

setting a roughness parameter based on the minimum finish value of the basic palette and the maximum finish value of the basic palette; and rendering an image from the PBR palette.

2. The method of claim 1, wherein the H-S palette comprises a palette in the Hue, Saturation, Value format.

3. The method of claim 1, wherein the H-S palette comprises a palette in the Hue, Saturation, Lightness format.

4. The method of claim 1, wherein obtaining an H-S palette corresponding to the model comprises converting the basic palette to the H-S palette.

5. The method of claim 1, wherein the pre-determined number of degrees comprises a Diffuse and Specular Nearness Parameter, and the method includes receiving specification of the Diffuse and Specular Nearness Parameter from a user interface.

6. A system comprising:

a memory to store:

a CAD model to be rendered, the CAD model having a plurality of materials; and a basic palette corresponding to the CAD model, the basic palette having a plurality of basic palette entries, each basic palette entry of the plurality of basic palette entries corresponding to a corresponding material from the plurality of materials; and an H-S palette corresponding to the CAD model, the H-S palette having a plurality of H-S palette entries, each H-S palette entry of the plurality of H-S palette entries corresponding to a corresponding material from the plurality of materials;

a set of modules configured to generate a set of PBR palette entries in a PBR palette corresponding to the CAD model, each PBR palette entry of the plurality of PBR palette entries corresponding to a corresponding material from the plurality of materials, the set of modules comprising:

a color determination module configured to determine, for each PBR palette entry, a color parameter;

a metalness module configured to determine, for each PBR palette entry, a metalness parameter by:

wherein specular hue is quantitatively specified in degrees on a color wheel and diffuse hue is quantitatively specified in degrees on said color wheel, by:

for each entry in which the specular hue is not near the diffuse hue, setting the metalness parameter to a value of zero; and for each entry in which the specular hue is near the diffuse hue, and for which a ratio of diffuse saturation to specular saturation is not less than a predetermined diffuse/saturation threshold, setting the metalness parameter to a value of one; and for each entry in which the specular hue is near the diffuse hue, and for which a ratio of diffuse saturation to specular saturation is less than the predetermined diffuse/saturation threshold, setting the metalness parameter to a value of the ratio of diffuse saturation to specular saturation, wherein the specular hue is near the diffuse hue if the specular hue is within a pre-determined number of degrees of the diffuse hue on the color wheel, and is otherwise not near the diffuse hue;

a roughness module configured to determine, for each PBR palette entry, a roughness parameter; and an image generation module configured to generate an image of the CAD model from the PBR palette.

7. The system of claim 6, further comprising a transformation module configured to generate the H-S palette from the basic palette.

8. The system of claim 6, wherein the color determination module is configured to determine, for each PBR palette entry, a color parameter by:

setting the color value of the PBR palette to a color selected from the specular color of the corresponding basic palette entry and the diffuse color of the corresponding basic palette entry.

9. The system of claim 6, wherein the pre-determined number of degrees comprises a Diffuse and Specular Nearness Parameter, and the method includes receiving specification of the Diffuse and Specular Nearness Parameter from a user interface.

10. The system of claim 6, wherein the metalness module is configured to determine, for each PBR palette entry, a metalness parameter by:

receiving specification of a Diffuse/Specular Threshold Parameter from a user interface; and comparing a ratio of diffuse hue to specular hue to the Diffuse/Specular Threshold Parameter.

11. A non-transitory computer readable medium having computer-executable code therein, in which the computer executable code, when executed by a computer, causes the computer to perform a method comprising:

obtaining a model for a computer-aided-design environment, the model comprising a plurality of materials;

obtaining a basic palette corresponding to the model, the basic palette comprising a plurality of basic palette entries, each basic palette entry of the plurality of basic palette entries corresponding to a material from the plurality of materials and having a corresponding finish value;

obtaining an H-S palette corresponding to the model, the H-S palette comprising a plurality of H-S entries, each H-S entry corresponding to a one of the basic palette entries, and comprising a corresponding hue parameter and a corresponding saturation parameter;

finding, from the plurality of basic palette entries, the minimum finish value and the maximum finish value;

creating, from the basic palette and the H-S palette, a physically based rendering ("PBR") palette for the model, the PBR palette comprising a plurality of PBR palette entries, each PBR entry corresponding to a one of the basic palette entries of the basic palette, by, for each PBR palette entry:

setting the color value of the PBR palette to a color selected from the specular color of the corresponding basic palette entry and the diffuse color of the corresponding basic palette entry;

setting a metalness parameter by assessing the specular hue and the diffuse hue from the corresponding H-S palette, wherein specular hue is quantitatively specified on a color wheel and diffuse hue is quantitatively specified on said color wheel, and wherein setting a metalness parameter by assessing the specular hue and the diffuse hue from the corresponding H-S palette comprises:

for each entry in which the specular hue is not near the diffuse hue, setting the metalness parameter to a value of zero; and for each entry in which the specular hue is near the diffuse hue, and for which a ratio of diffuse saturation to specular saturation is not less than a predetermined diffuse/saturation threshold, setting the metalness parameter to a value of one; and for each entry in which the specular hue is near the diffuse hue, and for which a ratio of diffuse saturation to specular saturation is less than the predetermined diffuse/saturation threshold, setting the metalness parameter to a value of the ratio of diffuse saturation to specular saturation, wherein the specular hue is near the diffuse hue if the specular hue is within a pre-determined number of degrees of the diffuse hue on the color wheel, and is otherwise not near the diffuse hue;

setting a roughness parameter based on the smallest finish value of the basic palette and the greatest finish value of the basic palette; and rendering the image from the PBR palette.

12. The non-transitory computer readable medium of claim 11, wherein the H-S palette comprises a palette in the Hue, Saturation, Value format.

13. The non-transitory computer readable medium of claim 11, wherein obtaining an H-S palette corresponding to the model comprises converting the basic palette to the H-S palette.

14. The non-transitory computer readable medium of claim 11, wherein assessing the specular hue and the diffuse hue from the corresponding H-S palette comprises:

receiving specification of a Diffuse/Specular Threshold Parameter from a user interface; and comparing a ratio of the diffuse hue to the specular hue to the Diffuse/Specular Threshold Parameter.

15. A computer-implemented method comprising:

obtaining a model for a computer-aided-design environment, the model comprising a plurality of materials and not comprising a PBR palette;

obtaining a basic palette corresponding to the model, the basic palette comprising a plurality of basic palette entries;

obtaining an H-S palette corresponding to the model, the H-S palette comprising a plurality of H-S entries, each H-S entry corresponding to a one of the basic palette entries, and comprising a corresponding hue parameter and a corresponding saturation parameter;

finding from the plurality of basic palette entries, the minimum finish value and the maximum finish value;

creating from the basic palette and the H-S palette, a physically based rendering ("PBR") palette for the model, the PBR palette comprising a plurality of PBR palette entries, each PBR entry corresponding to a one of the basic palette entries of the basic palette, by, for each PBR palette entry:

setting the color value of the PBR palette to a color selected from the specular color of the corresponding basic palette entry and the diffuse color of the corresponding basic palette entry;

setting a metalness parameter by assessing the specular hue and the diffuse hue from the corresponding H-S palette, wherein specular hue is quantitatively specified on a color wheel and diffuse hue is quantitatively specified on said color wheel, and wherein setting a metalness parameter by assessing the specular hue and the diffuse hue from the corresponding H-S palette comprises:

categorizing the PBR entry into one of a set of categories, and setting the metalness to a metalness value corresponding to the category, wherein the categories are selected from:

(a) a category for situations in which the specular hue is not near the diffuse hue, and the corresponding metalness value is zero;

(b) a category for situations in which the specular hue is near the diffuse hue and the ratio of diffuse saturation to specular saturation is less than a threshold, and the corresponding metalness value is the ratio divided by the threshold; and (c) a category for situations in which the specular hue is not near the diffuse hue and the ratio of diffuse saturation to specular saturation is not less than the threshold, and the corresponding metalness value is one;

setting a roughness parameter based on the minimum finish value of the basic palette and the maximum finish value of the basic palette; and rendering an image from the PBR palette.

16. The method of claim 1, wherein the H-S palette comprises a palette in the Hue, Saturation, Value format.

17. The method of claim 1, wherein the H-S palette comprises a palette in the Hue, Saturation, Lightness format.

18. The method of claim 1, wherein obtaining an H-S palette corresponding to the model comprises converting the basic palette to the H-S palette.

19. A system comprising:

a memory to store:

a CAD model to be rendered, the CAD model having a plurality of materials; and a basic palette corresponding to the CAD model, the basic palette having a plurality of basic palette entries, each basic palette entry of the plurality of basic palette entries corresponding to a corresponding material from the plurality of materials; and an H-S palette corresponding to the CAD model, the H-S palette having a plurality of H-S palette entries, each H-S palette entry of the plurality of H-S palette entries corresponding to a corresponding material from the plurality of materials;

a set of modules configured to generate a set of PBR palette entries in a PBR palette corresponding to the CAD model, each PBR palette entry of the plurality of PBR palette entries corresponding to a corresponding material from the plurality of materials, the set of modules comprising:

a color determination module configured to determine, for each PBR palette entry, a color parameter;

a metalness module configured to determine, for each PBR palette entry, a metalness parameter by:

categorizing the PBR entry into one of a set of categories, and setting the metalness parameter to a metalness value corresponding to the category, wherein the categories are selected from:

(a) a category for situations in which the specular hue is not near the diffuse hue, and the corresponding metalness value is zero;

(b) a category for situations in which the specular hue is near the diffuse hue and the ratio of diffuse saturation to specular saturation is less than a threshold, and the corresponding metalness value is the ratio divided by the threshold; and (c) a category for situations in which the specular hue is not near the diffuse hue and the ratio of diffuse saturation to specular saturation is not less than the threshold, and the corresponding metalness value is one;

a roughness module configured to determine, for each PBR palette entry, a roughness parameter; and an image generation module configured to generate an image of the CAD model from the PBR palette.

20. The system of claim 19, further comprising a transformation module configured to generate the H-S palette from the basic palette.

21. A non-transitory computer readable medium having computer-executable code therein, in which the computer executable code, when executed by a computer, causes the computer to perform a method comprising:

obtaining a model for a computer-aided-design environment, the model comprising a plurality of materials;

obtaining a basic palette corresponding to the model, the basic palette comprising a plurality of basic palette entries, each basic palette entry of the plurality of basic palette entries corresponding to a material from the plurality of materials and having a corresponding finish value;

obtaining an H-S palette corresponding to the model, the H-S palette comprising a plurality of H-S entries, each H-S entry corresponding to a one of the basic palette entries, and comprising a corresponding hue parameter and a corresponding saturation parameter;

finding, from the plurality of basic palette entries, the minimum finish value and the maximum finish value;

creating, from the basic palette and the H-S palette, a physically based rendering ("PBR") palette for the model, the PBR palette comprising a plurality of PBR palette entries, each PBR entry corresponding to a one of the basic palette entries of the basic palette, by, for each PBR palette entry:

setting the color value of the PBR palette to a color selected from the specular color of the corresponding basic palette entry and the diffuse color of the corresponding basic palette entry;

setting a metalness parameter by assessing the specular hue and the diffuse hue from the corresponding H-S palette, wherein specular hue is quantitatively specified on a color wheel and diffuse hue is quantitatively specified on said color wheel, and wherein setting a metalness parameter by assessing the specular hue and the diffuse hue from the corresponding H-S palette comprises:

categorizing the PBR entry into one of a set of categories, and setting the metalness to a metalness value corresponding to the category, wherein the categories are selected from:

(a) a category for situations in which the specular hue is not near the diffuse hue, and the corresponding metalness value is zero;

(b) a category for situations in which the specular hue is near the diffuse hue and the ratio of diffuse saturation to specular saturation is less than a threshold, and the corresponding metalness value is the ratio divided by the threshold; and (c) a category for situations in which the specular hue is not near the diffuse hue and the ratio of diffuse saturation to specular saturation is not less than the threshold, and the corresponding metalness value is one;

setting a roughness parameter based on the smallest finish value of the basic palette and the greatest finish value of the basic palette; and rendering the image from the PBR palette.

22. The non-transitory computer readable medium of claim 21, wherein the H-S palette comprises a palette in the Hue, Saturation, Value format.

23. The non-transitory computer readable medium of claim 21, wherein the H-S palette comprises a palette in the Hue, Saturation, Lightness format.

24. The non-transitory computer readable medium of claim 21, wherein obtaining an H-S palette corresponding to the model comprises converting the basic palette to the H-S palette.

* * * * *